United States Patent [19]
Wei

[11] Patent Number: 4,713,817
[45] Date of Patent: Dec. 15, 1987

[54] MULTIDIMENSIONAL, CONVOLUTIONALLY CODED COMMUNICATION SYSTEMS

[75] Inventor: Lee-Fang Wei, Westwood, Mass.
[73] Assignee: Codex Corporation, Mansfield, Mass.
[21] Appl. No.: 727,398
[22] Filed: Apr. 25, 1985
[51] Int. Cl.$^4$ ............................................. G06F 11/10
[52] U.S. Cl. ..................................... 371/43; 375/27; 375/39
[58] Field of Search ............... 371/43, 44, 45; 375/39, 375/53, 54, 57, 58, 27

[56] References Cited

U.S. PATENT DOCUMENTS

| | | | |
|---|---|---|---|
| 4,077,021 | 2/1978 | Csajka et al. | 322/9 |
| 4,084,137 | 4/1978 | Welti | 375/39 X |
| 4,457,004 | 6/1984 | Gersho et al. | 375/53 X |
| 4,483,012 | 11/1984 | Wei | 371/43 X |
| 4,493,082 | 1/1985 | Cumberton et al. | 371/43 |
| 4,520,490 | 5/1985 | Wei | 371/43 X |
| 4,581,601 | 4/1986 | Calderbank et al. | 375/94 |
| 4,583,236 | 4/1986 | Kromer et al. | 375/39 X |
| 4,586,182 | 4/1986 | Gallager | 371/43 X |
| 4,597,090 | 6/1986 | Forney, Jr. | 375/39 |
| 4,601,044 | 7/1986 | Kromer, III et al. | 371/43 X |

OTHER PUBLICATIONS

Ungerboeck, "Channel Coding with Multilevel/Phase Signals", IEEE Transaction on Information Theory, vol. IT-28, No. 1, Jan., 1982, pp. 55-67.
Forney, "The Viterbi Algorithm", Proceedings of the IEEE, vol. 61, No. 3, Mar., 1973, pp. 268-278.
Wei, "Rotationally Invariant Convolutional Channel Coding with Expanded Signal Space—Part I: 180°/Part II Nonlinear Codes", IEEE Journal on Selected Areas in Communications, vol. SAC-2, No. 5, Sep. 1984, pp. 659-686.
Fang & Lee, "Four-Dimensionally Coded PSK Systems for Combatting Effects of Severe ISI and CCI, IEEE, 1983, pp. 1032-1038.
Wilson & Sleeper, "Four Dimensional Modulation and Coding: An Alternate to Frequency-Reuse," Report No. UVA/528200/EE83/107, Sep. 1983.
Falconer, "Jointly Adaptive Equalization and Carrier Recovery in Two-Dimensional Digital Communication Systems", The Bell System Technical Journal, vol. 55, No. 3, Mar. 1976, pp. 317-334.
Calderbank & Sloane, "A New Family of Codes for Dial-Up Voice Lines", IEEE, pp. 673-676.
Forney et al., "Efficient Modulation for Band-Limited Channels", IEEE Journal on Selected Areas in Communications, vol. SAC-2, No. 5, Sep., 1984, pp. 632-647.

*Primary Examiner*—Charles E. Atkinson

[57] ABSTRACT

A family of multi-dimensional convolutionally coded modulation systems achieves enlarged minimum distance between possible sequences of signal points, reduced number of error events with the minimum distance, acceptable peak-to-average power ratio, reduced number of signal points in each constituent two-dimensional constellation, immunity to rapid carrier phase changes, and reduced complexity, resulting in a reduced error probability when maximum likelihood decoding is used.

These advantages are achieved by the construction and by the partitioning into subsets of the multi-dimensional constellation, by the design of convolutional codes using those multi-dimensional subsets, by using a bit converter and a block encoder to convert a multi-dimensional constellation mapping into multiple two-dimensional constellations mappings, and by a simplified decoding technique.

82 Claims, 24 Drawing Figures

NUMBER BENEATH EACH POINT: $Z2_{n+i}\ Z3_{n+i}\ Z4_{n+i}\ Z5_{n+i}\ Z6_{n+i}\ Z7_{n+i}\ (i = 0\ or\ 1)$

| 4D SUBSET | YO$_n$ | I1$_n$ | I2$_n'$ | I3$_n'$ | 4D TYPES | ZO$_n$ | Z1$_n$ | ZO$_{n+1}$ | Z1$_{n+1}$ |
|---|---|---|---|---|---|---|---|---|---|
| 0 | 0 | 0 | 0 | 0 | (A, A) | 0 | 0 | 0 | 0 |
|   | 0 | 0 | 0 | 1 | (B, B) | 0 | 1 | 0 | 1 |
| 1 | 0 | 0 | 1 | 0 | (C, C) | 1 | 0 | 1 | 0 |
|   | 0 | 0 | 1 | 1 | (D, D) | 1 | 1 | 1 | 1 |
| 2 | 0 | 1 | 0 | 0 | (A, B) | 0 | 0 | 0 | 1 |
|   | 0 | 1 | 0 | 1 | (B, A) | 0 | 1 | 0 | 0 |
| 3 | 0 | 1 | 1 | 0 | (C, D) | 1 | 0 | 1 | 1 |
|   | 0 | 1 | 1 | 1 | (D, C) | 1 | 1 | 1 | 0 |
| 4 | 1 | 0 | 0 | 0 | (A, C) | 0 | 0 | 1 | 0 |
|   | 1 | 0 | 0 | 1 | (B, D) | 0 | 1 | 1 | 1 |
| 5 | 1 | 0 | 1 | 0 | (C, B) | 1 | 0 | 0 | 1 |
|   | 1 | 0 | 1 | 1 | (D, A) | 1 | 1 | 0 | 0 |
| 6 | 1 | 1 | 0 | 0 | (A, D) | 0 | 0 | 1 | 1 |
|   | 1 | 1 | 0 | 1 | (B, C) | 0 | 1 | 1 | 0 |
| 7 | 1 | 1 | 1 | 0 | (C, A) | 1 | 0 | 0 | 0 |
|   | 1 | 1 | 1 | 1 | (D B) | 1 | 1 | 0 | 1 |

| $I1_{n+1}$ | $I2_{n+1}$ | $I3_{n+1}$ | $Z2_n$ | $Z3_n$ | $Z2_{n+1}$ | $Z3_{n+1}$ |
|---|---|---|---|---|---|---|
| 0 | 0 | 0 | 0 | 0 | 0 | 0 |
| 0 | 0 | 1 | 0 | 0 | 0 | 1 |
| 0 | 1 | 0 | 0 | 0 | 1 | 0 |
| 0 | 1 | 1 | 0 | 1 | 1 | 0 |
| 1 | 0 | 0 | 1 | 0 | 0 | 0 |
| 1 | 0 | 1 | 1 | 0 | 0 | 1 |
| 1 | 1 | 0 | 0 | 1 | 0 | 0 |
| 1 | 1 | 1 | 0 | 1 | 0 | 1 |

NUMBER BENEATH EACH POINT  $Z2_{n+i}\ Z3_{n+i}\ Z4_{n+i}\ Z5_{n+i}\ Z6_{n+i}\ Z7_{n+i}\ (i=0,1,2,3)$

| 8D SUBSET | $Y0_n$ | $I1_n$ | $I2_n$ | $I3_n$ | 8D TYPES |
|---|---|---|---|---|---|
| 0 | 0 | 0 | 0 | 0 | (0,0),(1,1),(2,2),(3,3) |
| 1 | 0 | 0 | 0 | 1 | (0,1),(1,0),(2,3),(3,2) |
| 2 | 0 | 0 | 1 | 0 | (0,2),(1,3),(2,0),(3,1) |
| 3 | 0 | 0 | 1 | 1 | (0,3),(1,2),(2,1),(3,0) |
| 4 | 0 | 1 | 0 | 0 | (4,4),(5,5),(6,6),(7,7) |
| 5 | 0 | 1 | 0 | 1 | (4,5),(5,4),(6,7),(7,6) |
| 6 | 0 | 1 | 1 | 0 | (4,6),(5,7),(6,4),(7,5) |
| 7 | 0 | 1 | 1 | 1 | (4,7),(5,6),(6,5),(7,4) |
| 8 | 1 | 0 | 0 | 0 | (0,4),(1,5),(2,6),(3,7) |
| 9 | 1 | 0 | 0 | 1 | (0,5),(1,4),(2,7),(3,6) |
| 10 | 1 | 0 | 1 | 0 | (0,6),(1,7),(2,4),(3,5) |
| 11 | 1 | 0 | 1 | 1 | (0,7),(1,6),(2,5),(3,4) |
| 12 | 1 | 1 | 0 | 0 | (4,0),(5,1),(6,2),(7,3) |
| 13 | 1 | 1 | 0 | 1 | (4,1),(5,0),(6,3),(7,2) |
| 14 | 1 | 1 | 1 | 0 | (4,2),(5,3),(6,0),(7,1) |
| 15 | 1 | 1 | 1 | 1 | (4,3),(5,2),(6,1),(7,0) |

*FIG. 12A*

STEP 1:

USE $YO_n\ I1_n\ I2_n\ I3_n$ TO OBTAIN AN 8D SUBTYPE

| $YO_n$ | $I1_n$ | $I2_n$ | $I3_n$ | 8D SUBTYPE |
|---|---|---|---|---|
| 0 | 0 | 0 | 0 | (A A A A) |
| 0 | 0 | 0 | 1 | (A A C C) |
| 0 | 0 | 1 | 0 | (A A A B) |
| 0 | 0 | 1 | 1 | (A A C D) |
| 0 | 1 | 0 | 0 | (A C A C) |
| 0 | 1 | 0 | 1 | (A C C B) |
| 0 | 1 | 1 | 0 | (A C A D) |
| 0 | 1 | 1 | 1 | (A C C A) |
| 1 | 0 | 0 | 0 | (A A A C) |
| 1 | 0 | 0 | 1 | (A A C B) |
| 1 | 0 | 1 | 0 | (A A A D) |
| 1 | 0 | 1 | 1 | (A A C A) |
| 1 | 1 | 0 | 0 | (A C A A) |
| 1 | 1 | 0 | 1 | (A C C C) |
| 1 | 1 | 1 | 0 | (A C A B) |
| 1 | 1 | 1 | 1 | (A C C D) |

STEP 2:
ROTATE THE $\begin{Bmatrix} 3RD\ \&\ 4TH \\ 2ND\ \&\ 4TH \\ 2ND\ \&\ 3RD \end{Bmatrix}$ 2D SUBSETS OF THE 8D SUBTYPE BY 180° IF $I4_n I5_n = \begin{Bmatrix} 01 \\ 10 \\ 11 \end{Bmatrix}$

STEP 3:

ROTATE ALL FOUR 2D SUBSETS OF THE 8D SUBTYPE OBTAINED IN STEP 2 BY $\begin{Bmatrix} 90° \\ 180° \\ 270° \end{Bmatrix}$ CLOCKWISE IF $I6'_n I7'_n = \begin{Bmatrix} 01 \\ 10 \\ 11 \end{Bmatrix}$ STEP 4:
CONVERT 2D SUBSETS TO $ZO_m Z1_m$, FOR $m=n, n+1, n+2, n+3$ BASED ON THE FOLLOWING TABLE

| 2D SUBSET | A | B | C | D |
|---|---|---|---|---|
| $ZO_m\ Z1_m$ | 00 | 01 | 10 | 11 |

| Current State | Next State 0-7 | Next State 16-23 | Next State 32-39 | Next State 48-55 |
|---|---|---|---|---|
| 0 | 0 1 4 5 2 3 6 7 | | | |
| 2 | | 4 5 0 1 6 7 2 3 | | |
| 4 | | | 1 0 5 4 3 2 7 6 | |
| 6 | | | | 5 4 1 0 7 6 3 2 |
| 8 | 4 5 0 1 6 7 2 3 | | | |
| 10 | | 0 1 4 5 2 3 6 7 | | |
| 12 | | | 5 4 0 1 7 6 3 2 | |
| 14 | | | | 1 0 5 4 3 2 7 6 |
| 16 | 2 3 6 7 0 1 4 5 | | | |
| 18 | | 6 7 2 3 4 5 0 1 | | |
| 20 | | | 3 2 7 6 1 0 5 4 | |
| 22 | | | | 7 6 3 2 5 4 1 0 |
| 24 | 6 7 2 3 4 5 0 1 | | | |
| 26 | | 2 3 6 7 0 1 4 5 | | |
| 28 | | | 7 6 3 2 5 4 1 0 | |
| 30 | | | | 3 2 7 6 1 0 5 4 |
| 32 | 5 4 1 0 7 6 3 2 | | | |
| 34 | | 1 0 5 4 3 2 7 6 | | |
| 36 | | | 4 5 0 1 6 7 2 3 | |
| 38 | | | | 0 1 4 5 2 3 6 7 |
| 40 | 1 0 5 4 3 2 7 6 | | | |
| 42 | | 5 4 1 0 7 6 3 2 | | |
| 44 | | | 0 1 4 5 2 3 6 7 | |
| 46 | | | | 4 5 0 1 6 7 2 3 |
| 48 | 7 6 3 2 5 4 1 0 | | | |
| 50 | | 3 2 7 6 1 0 5 4 | | |
| 52 | | | 6 7 2 3 4 5 0 1 | |
| 54 | | | | 2 3 6 7 0 1 4 5 |
| 56 | 3 2 7 6 1 0 5 4 | | | |
| 58 | | 7 6 3 2 5 4 1 0 | | |
| 60 | | | 2 3 6 7 0 1 4 5 | |
| 62 | | | | 6 7 2 3 4 5 0 1 |

\* CURRENT STATE = $W1_n W2_n W3_n W4_n W5_n W6_n$
\* NEXT STATE = $W1_{n+4} W2_{n+4} W3_{n+4} W4_{n+4} W5_{n+4} W6_{n+4}$
\* 8D SUBSET = $Y0_n I1_n I2_n I3_n$

138

| CURRENT STATE | NEXT STATE | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| | 8 | 9 | 10 | 11 | 12 | 13 | 14 | 15 | 24 | 25 | 26 | 27 | 28 | 29 | 30 | 31 | 40 | 41 | 42 | 43 | 44 | 45 | 46 | 47 | 56 | 57 | 58 | 59 | 60 | 61 | 62 | 63 |
| 1 | 8 | 9 | 12 | 13 | 10 | 11 | 14 | 15 | | | | | | | | | | | | | | | | | | | | | | | | |
| 3 | | | | | | | | | 12 | 13 | 8 | 9 | 14 | 15 | 10 | 11 | | | | | | | | | | | | | | | | |
| 5 | | | | | | | | | | | | | | | | | 9 | 8 | 13 | 12 | 11 | 10 | 15 | 14 | | | | | | | | |
| 7 | | | | | | | | | | | | | | | | | | | | | | | | | 13 | 12 | 9 | 8 | 15 | 14 | 11 | 10 |
| 9 | 12 | 13 | 8 | 9 | 14 | 15 | 10 | 11 | | | | | | | | | | | | | | | | | | | | | | | | |
| 11 | | | | | | | | | 8 | 9 | 12 | 13 | 10 | 11 | 14 | 15 | | | | | | | | | | | | | | | | |
| 13 | | | | | | | | | | | | | | | | | 13 | 12 | 9 | 8 | 15 | 14 | 11 | 10 | | | | | | | | |
| 15 | | | | | | | | | | | | | | | | | | | | | | | | | 9 | 8 | 13 | 12 | 11 | 10 | 15 | 14 |
| 17 | 10 | 11 | 14 | 15 | 8 | 9 | 12 | 13 | | | | | | | | | | | | | | | | | | | | | | | | |
| 19 | | | | | | | | | 14 | 15 | 10 | 11 | 12 | 13 | 8 | 9 | | | | | | | | | | | | | | | | |
| 21 | | | | | | | | | | | | | | | | | 11 | 10 | 15 | 14 | 9 | 8 | 13 | 12 | | | | | | | | |
| 23 | | | | | | | | | | | | | | | | | | | | | | | | | 15 | 14 | 11 | 10 | 13 | 12 | 9 | 8 |
| 25 | 14 | 15 | 10 | 11 | 12 | 13 | 8 | 9 | | | | | | | | | | | | | | | | | | | | | | | | |
| 27 | | | | | | | | | 10 | 11 | 14 | 15 | 8 | 9 | 12 | 13 | | | | | | | | | | | | | | | | |
| 29 | | | | | | | | | | | | | | | | | 15 | 14 | 11 | 10 | 13 | 12 | 9 | 8 | | | | | | | | |
| 31 | | | | | | | | | | | | | | | | | | | | | | | | | 11 | 10 | 15 | 14 | 9 | 8 | 13 | 12 |
| 33 | 13 | 12 | 9 | 8 | 15 | 14 | 11 | 10 | | | | | | | | | | | | | | | | | | | | | | | | |
| 35 | | | | | | | | | 9 | 8 | 13 | 12 | 11 | 10 | 15 | 14 | | | | | | | | | | | | | | | | |
| 37 | | | | | | | | | | | | | | | | | 12 | 13 | 8 | 9 | 14 | 15 | 10 | 11 | | | | | | | | |
| 39 | | | | | | | | | | | | | | | | | | | | | | | | | 8 | 9 | 12 | 13 | 10 | 11 | 14 | 15 |
| 41 | 9 | 8 | 13 | 12 | 11 | 10 | 15 | 14 | | | | | | | | | | | | | | | | | | | | | | | | |
| 43 | | | | | | | | | 13 | 12 | 9 | 8 | 15 | 14 | 11 | 10 | | | | | | | | | | | | | | | | |
| 45 | | | | | | | | | | | | | | | | | 8 | 9 | 12 | 13 | 10 | 11 | 14 | 15 | | | | | | | | |
| 47 | | | | | | | | | | | | | | | | | | | | | | | | | 12 | 13 | 8 | 9 | 14 | 15 | 10 | 11 |
| 49 | 15 | 14 | 11 | 10 | 13 | 12 | 9 | 8 | | | | | | | | | | | | | | | | | | | | | | | | |
| 51 | | | | | | | | | 11 | 10 | 15 | 14 | 9 | 8 | 13 | 12 | | | | | | | | | | | | | | | | |
| 53 | | | | | | | | | | | | | | | | | 14 | 15 | 10 | 11 | 12 | 13 | 8 | 9 | | | | | | | | |
| 55 | | | | | | | | | | | | | | | | | | | | | | | | | 10 | 11 | 14 | 15 | 8 | 9 | 12 | 13 |
| 57 | 11 | 10 | 15 | 14 | 9 | 8 | 13 | 12 | | | | | | | | | | | | | | | | | | | | | | | | |
| 59 | | | | | | | | | 15 | 14 | 11 | 10 | 13 | 12 | 9 | 8 | | | | | | | | | | | | | | | | |
| 61 | | | | | | | | | | | | | | | | | 10 | 11 | 14 | 15 | 8 | 9 | 12 | 13 | | | | | | | | |
| 63 | | | | | | | | | | | | | | | | | | | | | | | | | 14 | 15 | 10 | 11 | 12 | 13 | 8 | 9 |

*FIG. 14B*

WHEN $I1_{n+1} = 0$, $Z4_n = I3_{n+1}$, $Z4_{n+1} = I5_{n+1}$ $Z3_n = I2_{n+1}$, $Z3_{n+1} = I4_{n+1}$ $Z2_n = 0$, $Z2_{n+1} = 0$ $Z4_{n+2} = I7_{n+1}$, $Z4_{n+3} = I2_{n+2}$ $Z3_{n+2} = I6_{n+1}$, $Z3_{n+3} = I1_{n+2}$ $Z2_{n+2} = 0$, $Z2_{n+3} = 0$

WHEN $I1_{n+1} = 1$ THEN

NUMBER BENEATH EACH POINT: $Z3_{n+i}$ $Z4_{n+i}$ $Z5_{n+i}$ $Z6_{n+i}$ $Z7_{n+i}$ ( i = 0,1)

| 4D SUBSET | Y0n | I1n | I2n | I3'n | I4'n | I5n | 4D TYPES | Z0n | Z1n | Z2n | Z0n+1 | Z1n+1 | Z2n+1 |
|---|---|---|---|---|---|---|---|---|---|---|---|---|---|
| 0 | 0 | 0 | 0 | 0 | 0 | 0 | (A,A) | 0 | 0 | 0 | 0 | 0 | 0 |
|   | 0 | 0 | 0 | 0 | 0 | 1 | (B,B) | 0 | 1 | 0 | 0 | 1 | 0 |
| 1 | 0 | 0 | 0 | 0 | 1 | 0 | (C,C) | 0 | 0 | 1 | 0 | 0 | 1 |
|   | 0 | 0 | 0 | 0 | 1 | 1 | (D,D) | 0 | 1 | 1 | 0 | 1 | 1 |
| 2 | 0 | 0 | 0 | 1 | 0 | 0 | (E,E) | 1 | 1 | 0 | 1 | 1 | 0 |
|   | 0 | 0 | 0 | 1 | 0 | 1 | (F,F) | 1 | 0 | 1 | 1 | 0 | 1 |
| 3 | 0 | 0 | 0 | 1 | 1 | 0 | (G,G) | 1 | 1 | 1 | 1 | 1 | 1 |
|   | 0 | 0 | 0 | 1 | 1 | 1 | (H,H) | 1 | 0 | 0 | 1 | 0 | 0 |
| 4 | 0 | 0 | 1 | 0 | 0 | 0 | (A,C) | 0 | 0 | 0 | 0 | 0 | 1 |
|   | 0 | 0 | 1 | 0 | 0 | 1 | (B,D) | 0 | 1 | 0 | 0 | 1 | 1 |
| 5 | 0 | 0 | 1 | 0 | 1 | 0 | (C,A) | 0 | 0 | 1 | 0 | 0 | 0 |
|   | 0 | 0 | 1 | 0 | 1 | 1 | (D,B) | 0 | 1 | 1 | 0 | 1 | 0 |
| 6 | 0 | 0 | 1 | 1 | 0 | 0 | (E,G) | 1 | 1 | 0 | 1 | 1 | 1 |
|   | 0 | 0 | 1 | 1 | 0 | 1 | (F,H) | 1 | 0 | 1 | 1 | 0 | 0 |
| 7 | 0 | 0 | 1 | 1 | 1 | 0 | (G,E) | 1 | 1 | 1 | 1 | 1 | 0 |
|   | 0 | 0 | 1 | 1 | 1 | 1 | (H,F) | 1 | 0 | 0 | 1 | 0 | 1 |
| 8 | 0 | 1 | 0 | 0 | 0 | 0 | (A,B) | 0 | 0 | 0 | 0 | 1 | 0 |
|   | 0 | 1 | 0 | 0 | 0 | 1 | (B,A) | 0 | 1 | 0 | 0 | 0 | 0 |
| 9 | 0 | 1 | 0 | 0 | 1 | 0 | (C,D) | 0 | 0 | 1 | 0 | 1 | 1 |
|   | 0 | 1 | 0 | 0 | 1 | 1 | (D,C) | 0 | 1 | 1 | 0 | 0 | 1 |
| 10 | 0 | 1 | 0 | 1 | 0 | 0 | (E,F) | 1 | 1 | 0 | 1 | 0 | 1 |
|    | 0 | 1 | 0 | 1 | 0 | 1 | (F,E) | 1 | 0 | 1 | 1 | 1 | 0 |
| 11 | 0 | 1 | 0 | 1 | 1 | 0 | (G,H) | 1 | 1 | 1 | 1 | 0 | 0 |
|    | 0 | 1 | 0 | 1 | 1 | 1 | (H,G) | 1 | 0 | 0 | 1 | 1 | 1 |
| 12 | 0 | 1 | 1 | 0 | 0 | 0 | (A,D) | 0 | 0 | 0 | 0 | 1 | 1 |
|    | 0 | 1 | 1 | 0 | 0 | 1 | (B,C) | 0 | 1 | 0 | 0 | 0 | 1 |
| 13 | 0 | 1 | 1 | 0 | 1 | 0 | (C,B) | 0 | 0 | 1 | 0 | 1 | 0 |
|    | 0 | 1 | 1 | 0 | 1 | 1 | (D,A) | 0 | 1 | 1 | 0 | 0 | 0 |
| 14 | 0 | 1 | 1 | 1 | 0 | 0 | (E,H) | 1 | 1 | 0 | 1 | 0 | 0 |
|    | 0 | 1 | 1 | 1 | 0 | 1 | (F,G) | 1 | 0 | 1 | 1 | 1 | 1 |
| 15 | 0 | 1 | 1 | 1 | 1 | 0 | (G,F) | 1 | 1 | 1 | 1 | 0 | 1 |
|    | 0 | 1 | 1 | 1 | 1 | 1 | (H,E) | 1 | 0 | 0 | 1 | 1 | 0 |
| 16 | 1 | 0 | 0 | 0 | 0 | 0 | (A,E) | 0 | 0 | 0 | 1 | 1 | 0 |
|    | 1 | 0 | 0 | 0 | 0 | 1 | (B,F) | 0 | 1 | 0 | 1 | 0 | 1 |
| 17 | 1 | 0 | 0 | 0 | 1 | 0 | (C,G) | 0 | 0 | 1 | 1 | 1 | 1 |
|    | 1 | 0 | 0 | 0 | 1 | 1 | (D,H) | 0 | 1 | 1 | 1 | 1 | 0 |
| 18 | 1 | 0 | 0 | 1 | 0 | 0 | (E,C) | 1 | 1 | 0 | 0 | 0 | 1 |
|    | 1 | 0 | 0 | 1 | 0 | 1 | (F,D) | 1 | 0 | 1 | 0 | 1 | 1 |
| 19 | 1 | 0 | 0 | 1 | 1 | 0 | (G,A) | 1 | 1 | 1 | 0 | 0 | 0 |
|    | 1 | 0 | 0 | 1 | 1 | 1 | (H,B) | 1 | 0 | 0 | 0 | 1 | 0 |
| 20 | 1 | 0 | 1 | 0 | 0 | 0 | (A,G) | 0 | 0 | 0 | 1 | 1 | 1 |
|    | 1 | 0 | 1 | 0 | 0 | 1 | (B,H) | 0 | 1 | 0 | 1 | 0 | 0 |
| 21 | 1 | 0 | 1 | 0 | 1 | 0 | (C,E) | 0 | 0 | 1 | 1 | 1 | 0 |
|    | 1 | 0 | 1 | 0 | 1 | 1 | (D,F) | 0 | 1 | 1 | 1 | 0 | 1 |
| 22 | 1 | 0 | 1 | 1 | 0 | 0 | (E,A) | 1 | 1 | 0 | 0 | 0 | 0 |
|    | 1 | 0 | 1 | 1 | 0 | 1 | (F,B) | 1 | 0 | 1 | 0 | 1 | 0 |
| 23 | 1 | 0 | 1 | 1 | 1 | 0 | (G,C) | 1 | 1 | 1 | 0 | 0 | 1 |
|    | 1 | 0 | 1 | 1 | 1 | 1 | (H,D) | 1 | 0 | 0 | 0 | 0 | 1 |
| 24 | 1 | 1 | 0 | 0 | 0 | 0 | (A,F) | 0 | 0 | 0 | 1 | 0 | 1 |
|    | 1 | 1 | 0 | 0 | 0 | 1 | (B,E) | 0 | 1 | 0 | 1 | 1 | 0 |
| 25 | 1 | 1 | 0 | 0 | 1 | 0 | (C,H) | 0 | 0 | 1 | 1 | 0 | 0 |
|    | 1 | 1 | 0 | 0 | 1 | 1 | (D,G) | 0 | 1 | 1 | 1 | 1 | 1 |
| 26 | 1 | 1 | 0 | 1 | 0 | 0 | (E,D) | 1 | 1 | 0 | 0 | 1 | 1 |
|    | 1 | 1 | 0 | 1 | 0 | 1 | (F,C) | 1 | 0 | 1 | 0 | 0 | 0 |
| 27 | 1 | 1 | 0 | 1 | 1 | 0 | (G,B) | 1 | 1 | 1 | 0 | 1 | 0 |
|    | 1 | 1 | 0 | 1 | 1 | 1 | (H,A) | 1 | 0 | 0 | 0 | 0 | 0 |
| 28 | 1 | 1 | 1 | 0 | 0 | 0 | (A,H) | 0 | 0 | 0 | 1 | 0 | 0 |
|    | 1 | 1 | 1 | 0 | 0 | 1 | (B,G) | 0 | 1 | 0 | 1 | 1 | 1 |
| 29 | 1 | 1 | 1 | 0 | 1 | 0 | (C,F) | 0 | 0 | 1 | 1 | 0 | 1 |
|    | 1 | 1 | 1 | 0 | 1 | 1 | (D,E) | 0 | 1 | 1 | 1 | 1 | 0 |
| 30 | 1 | 1 | 1 | 1 | 0 | 0 | (E,B) | 1 | 1 | 0 | 0 | 1 | 0 |
|    | 1 | 1 | 1 | 1 | 0 | 1 | (F,A) | 1 | 0 | 1 | 0 | 0 | 0 |
| 31 | 1 | 1 | 1 | 1 | 1 | 0 | (G,D) | 1 | 1 | 1 | 0 | 1 | 1 |
|    | 1 | 1 | 1 | 1 | 1 | 1 | (H,C) | 1 | 0 | 0 | 0 | 0 | 1 |

| 16D SUBSET | 16D TYPES | | | |
|---|---|---|---|---|
| 0 | (0,0) | (1,1) | (2,2) | (3,3) |
|  | (4,4) | (5,5) | (6,6) | (7,7) |
| 1 | (0,1) | (1,2) | (2,3) | (3,4) |
|  | (4,5) | (5,6) | (6,7) | (7,0) |
| 2 | (0,2) | (1,3) | (2,4) | (3,5) |
|  | (4,6) | (5,7) | (6,0) | (7,1) |
| 3 | (0,3) | (1,4) | (2,5) | (3,6) |
|  | (4,7) | (5,0) | (6,1) | (7,2) |
| 4 | (0,4) | (1,5) | (2,6) | (3,7) |
|  | (4,0) | (5,1) | (6,2) | (7,3) |
| 5 | (0,5) | (1,6) | (2,7) | (3,0) |
|  | (4,1) | (5,2) | (6,3) | (7,4) |
| 6 | (0,6) | (1,7) | (2,0) | (3,1) |
|  | (4,2) | (5,3) | (6,4) | (7,5) |
| 7 | (0,7) | (1,0) | (2,1) | (3,2) |
|  | (4,3) | (5,4) | (6,5) | (7,6) |
| 8 | (8,8) | (9,9) | (10,10) | (11,11) |
|  | (12,12) | (13,13) | (14,14) | (15,15) |
| 9 | (8,9) | (9,10) | (10,11) | (11,12) |
|  | (12,13) | (13,14) | (14,15) | (15,8) |
| 10 | (8,10) | (9,11) | (10,12) | (11,13) |
|  | (12,14) | (13,15) | (14,8) | (15,9) |
| 11 | (8,11) | (9,12) | (10,13) | (11,14) |
|  | (12,15) | (13,8) | (14,9) | (15,10) |
| 12 | (8,12) | (9,13) | (10,14) | (11,15) |
|  | (12,8) | (13,9) | (14,10) | (15,11) |
| 13 | (8,13) | (9,14) | (10,15) | (11,8) |
|  | (12,9) | (13,10) | (14,11) | (15,12) |
| 14 | (8,14) | (9,15) | (10,8) | (11,9) |
|  | (12,10) | (13,11) | (14,12) | (15,13) |
| 15 | (8,15) | (9,8) | (10,9) | (11,10) |
|  | (12,11) | (13,12) | (14,13) | (15,14) |

*FIG. 21A*

| 16D SUBSET | 16D TYPES | | | |
|---|---|---|---|---|
| 16 | (0, 8) | (1, 9) | (2, 10) | (3, 11) |
|  | (4, 12) | (5, 13) | (6, 14) | (7, 15) |
| 17 | (0, 9) | (1, 10) | (2, 11) | (3, 12) |
|  | (4, 13) | (5, 14) | (6, 15) | (7, 8) |
| 18 | (0, 10) | (1, 11) | (2, 12) | (3, 13) |
|  | (4, 14) | (5, 15) | (6, 8) | (7, 9) |
| 19 | (0, 11) | (1, 12) | (2, 13) | (3, 14) |
|  | (4, 15) | (5, 8) | (6, 9) | (7, 10) |
| 20 | (0, 12) | (1, 13) | (2, 14) | (3, 15) |
|  | (4, 8) | (5, 9) | (6, 10) | (7, 11) |
| 21 | (0, 13) | (1, 14) | (2, 15) | (3, 8) |
|  | (4, 9) | (5, 10) | (6, 11) | (7, 12) |
| 22 | (0, 14) | (1, 15) | (2, 8) | (3, 9) |
|  | (4, 10) | (5, 11) | (6, 12) | (7, 13) |
| 23 | (0, 15) | (1, 8) | (2, 9) | (3, 10) |
|  | (4, 11) | (5, 12) | (6, 13) | (7, 14) |
| 24 | (8, 0) | (9, 1) | (10, 2) | (11, 3) |
|  | (12, 4) | (13, 5) | (14, 6) | (15, 7) |
| 25 | (8, 1) | (9, 2) | (10, 3) | (11, 4) |
|  | (12, 5) | (13, 6) | (14, 7) | (15, 0) |
| 26 | (8, 2) | (9, 3) | (10, 4) | (11, 5) |
|  | (12, 6) | (13, 7) | (14, 0) | (15, 1) |
| 27 | (8, 3) | (9, 4) | (10, 5) | (11, 6) |
|  | (12, 7) | (13, 0) | (14, 1) | (15, 2) |
| 28 | (8, 4) | (9, 5) | (10, 6) | (11, 7) |
|  | (12, 0) | (13, 1) | (14, 2) | (15, 3) |
| 29 | (8, 5) | (9, 6) | (10, 7) | (11, 0) |
|  | (12, 1) | (13, 2) | (14, 3) | (15, 4) |
| 30 | (8, 6) | (9, 7) | (10, 0) | (11, 1) |
|  | (12, 2) | (13, 3) | (14, 4) | (15, 5) |
| 31 | (8, 7) | (9, 0) | (10, 1) | (11, 2) |
|  | (12, 3) | (13, 4) | (14, 5) | (15, 6) |

*FIG. 21B*

MULTIDIMENSIONAL, CONVOLUTIONALLY CODED COMMUNICATION SYSTEMS

BACKGROUND OF THE INVENTION

This invention relates to transmitting a stream of information bits by sending a corresponding sequence of signals over a channel in a plurality of signaling slots.

In typical so-called uncoded communication systems, the Q information bits appearing in a signaling slot are used to select a signal point from a two-dimensional (2D) constellation having $2^Q$ signal points. The choice of the signal point to be sent in a given signaling slot is unrelated to the choice of the signal points to be sent in other signaling slots. The receiver estimates which signal point was sent by simply finding the nearest 2D signal point to the received, noise altered signal. The immunity of such a system to noise depends on the minimum distance between any two signal points in the 2D constellation.

Various techniques have been developed for improving the noise immunity of such systems.

For example, in so-called convolutionally coded systems of the type disclosed in Csajka et al., U.S. Pat. No. 4,077,021, and Ungerboeck, "Channel Coding with Multilevel/Phase Signals," IEEE Transactions on Information Theory, Vol. IT-28, pp. 55-67, January, 1982, the 2D constellation is doubled in size to include $2^{Q+1}$ signal points. a convolutional coder in the transmitter adds a redundancy bit to the Q information bits appearing in a signaling slot and the resulting Q+1 bits are used to select a signal point to be sent. The $2^{Q+1}$ signal points in the 2D constellation are partitioned into equal-sized subsets which have the property that the minimum distance between any two signal points in a subset is larger than the minimum distance between any two signal points in the constellation.

The convolutional coder is arranged so that the signal points to be sent are respectively drawn only from certain allowed sequences of subsets. The receiver estimates the sequence of sent signal points as those signal points from an allowed sequence of 2D subsets that are nearest (in the aggregate) to the sequence of received, noise altered signals. The immunity of such a convolutionally coded system to noise depends on the minimum distance between any two allowed sequences of 2D points. Because the minimum distance is larger than that of an uncoded system, a coding gain results. One cost of the system is that the size of the 2D constellation is doubled, offsetting some of the coding gain.

In the Csajka and Ungerboeck scheme, decoding is by means of the Viterbi algorithm described in Forney, "The Viterbi Algorithm", Proc. IEEE, Vol. 61, pp. 268-278, March, 1973, incorporated herein by reference.

Wei, "Rotationally Invariant Convolutional Channel Coding with Expanded Signal Space—Part I: 180° and Part II: Nonlinear Codes", IEEE Journal on Selected Areas in Communications, Vol. SAC-2, pp. 659-686, September, 1984, describes convolutionally coded systems of the Csajka and Ungerboeck type that are capable of differential encoding for immunity to rapid carrier phase changes.

In so-called block coded systems (for example, those systems disclosed in Forney, U.S. patent application Ser. No. 485,069, filed Apr. 14, 1983, and now U.S. Pat. No. 4,597,090 issued 6-24-86, assigned to the same assignee as this application, and incorporated herein by reference) the information bits appearing in a block of more than one signaling slot are used to select a multidimensional signal point from a multi-dimensional constellation for transmission. A multi-dimensional constellation can be conceived as a concatenation of a number of constituent 2D constellations, the number being the number of signaling slots in a block. A multi-dimensional signal point is a concatenation of constituent 2D signal points, one from each constitutent 2D constellation. (In this respect, concatenating constituent signal points means assembling the coordinates of the respective constituent signal points as coordinates of a multi-dimensional signal point; concatenating constituent constellations means concatenating the respective signal points of the constituent constellations.) Certain dependencies exist between the constituent 2D signal points of a multi-dimensional signal point selected for a block. A coding gain results from those dependencies. However, no dependency exists between the two multi-dimensional signal points selected for any two blocks of signaling slots.

Multidimensional, convolutionally coded systems have also been proposed in which dependencies do exist between the multi-dimensional signal points selected for different blocks.

One such system is proposed in Gallager, U.S. patent application Ser. No. 577,044, filed Feb. 6, 1984, assigned to the same assignee as this application, and incorporated herein by reference.

Gallager shows a four-dimensional (4D) convolutionally coded system that uses a 240 signal point rectangular constituent 2D constellation to send 7 information bits per signaling slot. The 2D constellation is partitioned into four subsets. In Gallager the 14 information bits appearing in each block of two signaling slots are expanded (by a rate ¾ 8-state convolutional coder) to 15 selection bits used to select a 4D signal point in a 4D constellation. The 4D constellation is a concatenation of two 240 signal point constituent 2D constellations and is partitioned into 16 4D subsets each of which is a concatenation of two of the 2D subsets. (A 4D subset is a concatenation of two 2D subsets if every 4D point in the 4D subset is a concatenation of two 2D points from those two 2D subsets respectively). The signal point selection bits include four subset selection bits that are associated with 4D subsets in such a way that the Hamming distance between the allowed sequences of subset selection bits is indicative of the minimum squared distance between allowed sequences of 4D signal points. Gallager differentially encodes the bits fed to the convolutional coder in order to accomplish transparency to channel-induced phase rotations of 180°.

Another 4D convolutionally coded system is disclosed in Fang and Lee, "Four-Dimensionally Coded PSK Systems for Combatting Effects of Severe ISI and CCI", Globecom, 1983, pp. 1032-1038. They use a $2^{Q+1}$ signal point circular constituent 2D constellation to send Q information bits per signaling slot. The 4D constellation is a concatenation of two $2^{Q+1}$ signal point circular constituent 2D constellations. $2^{2Q+1}$ out of $2^{2Q+2}$ possible 4D signal points are selected for transmission. The selection is made such that the minimum distance between any two selected 4D signal points is maximized. The $2^{2Q+1}$ selected 4D signal points are partitioned into equal-sized subsets such that the minimum distance between any two 4D signal points in a subset is larger than that between any two selected 4D signal points. The partitioning is made directly on the 4D constellation without referring to a partitioning of the constituent 2D constellations. A convolutional coder of up to eight states is used to expand the 2Q information bits appearing in each block of two signaling slots to 2Q+1 selection bits to select a 4D signal point.

Another 4D convolutionally coded system is disclosed in Wilson and Sleeper, "Four-Dimensional Modulation and Coding: An Alternate to Frequency Reuse", NASA Report, UVA/528200/EE83/107, September, 1983. Their 4D constellation is taken from a 4D lattice (i.e., a regular arrangement of signal points) used for a block coded system. The partitioning of the 4D constellation into subsets is done directly without referring to a partitioning of the constituent 2D constellations. Preliminary investigations on the design of convolutional codes with four states or less are made for Q up to 2.

SUMMARY OF THE INVENTION

One general feature of the invention is transmitting apparatus that defines a partitioning of the multi-dimensional constellation into multi-dimensional subsets such that each multi-dimensional subset is based upon constituent subsets of the constituent constellations of the multi-dimensional constellation, but is other than a concatenation of such constituent subsets.

The preferred embodiments include the following features. The multi-dimensional subset from which a multi-dimensional signal point is drawn is selected based on convolutionally encoded bits from a convolutional coder. The partitioning of the multi-dimensional constellation into subsets is based on the minimum distances within constituent subsets, and subfamilies and families of constituent subsets of each constituent constellation, and multi-dimensional subsets are grouped to form multi-dimensional families also based on those distances. Each multi-dimensional subset is made up of multi-dimensional types each of which is a concatenation of constituent subsets. The constituent subsets that belong to a given constituent constellation and that are associated with multi-dimensional types of a given multi-dimensional subset, are different and belong to one constituent family (or one subfamily) of that constituent constellation.

Another general feature of the invention is transmitting apparatus that defines a partitioning of the multi-dimensional constellation and establishes a correspondence between signal point selection bits and the coordinates of a multi-dimensional signal point in such a way that the multi-dimensional signal points are susceptible to being decoded in a manner that avoids the effect of channel-induced phase rotations of any amount for which the constituent constellations of the multi-dimensional constellation would have a phase rotation ambiguity.

In some preferred embodiments, each constituent subset is translated into another constituent subset under a phase rotation amount corresponding to one of the constituent constellation phase ambiguities, and the multi-dimensional constellation is partitioned by grouping multi-dimensional types into multi-dimensional subsets such that each multi-dimensional subset is rotationally invariant under that phase rotation amount.

Some preferred embodiments include the following features. Partitioning is defined so that each multi-dimensional subset is invariant under a phase rotation of any of the phase ambiguity amounts. The transmitting apparatus includes a convolutional coder whose output bits are used to select the multi-dimensional subset from which a multi-dimensional signal point is drawn, and a differential encoder which differentially encodes at least one non-convolutionally encoded information bit to remove the phase rotation ambiguities. In particular, the differential encoder can be arranged to differentially encode only non-convolutionally encoded information bits.

Other preferred embodiments include the following features. The multi-dimensional subsets are rotationally invariant under phase rotations of some but not all of the phase rotational ambiguities of the constituent constellations, and are translated into other multi-dimensional subsets under a phase rotation of another of the phase rotation ambiguities of the constituent constellations, and the convolutional coder has state transitions that are associated with the multi-dimensional subsets in such a way as to remove the latter phase rotation ambiguity. This is accomplished by assigning the multi-dimensional subset which results from rotating the first multi-dimensional subset by the latter ambiguity to a state transition which is determined based on a one-to-one function of the transition to which the first multi-dimensional subset is assigned. The convolutional coder generates the convolutionally-encoded bits from bits which include at least one differentially encoded information bit. At least one non-convolutionally encoded information bit is also differentially encoded to remove the former phase rotation ambiguities.

In another general feature of the invention, each multi-dimensional subset comprises at least two multi-dimensional subtypes each of which is a concatenation of constituent 2D subsets, and the subtype from which a multi-dimensional signal point is drawn is selected based on the convolutionally-encoded bits and at least one non-convolutionally-encoded subtype selection information bit.

Preferred embodiments include the following features. The transmitter includes a bit converter that translates each bit value combination of the subtype selection bit and the convolutionally encoded bits into groups of constituent 2D subset selection bits, each group being used to specify a constituent 2D subset corresponding to the multi-dimensional subtype. The multi-dimensional signal point in that subtype is selected based on the remaining information bits. At least one subtype selection bit is differentially encoded to avoid phase ambiguities of the constituent constellations. Each constituent 2D subset is divided into first and second groups and the group from which one constituent signal point is drawn depends on the group from which another constituent signal point is drawn. The transmitter includes a block encoder that produces, from at least one remaining information bit, sets of group selection bits used respectively to specify the constituent groups. The other remaining information bits are organized into sets each used to select a constituent signal point from one of the constituent groups. The first and second groups of each constituent 2D subset translate respectively into first and second groups of other constituent 2D subsets upon rotations corresponding to phase rotation ambiguities of the constituent 2D constellations. The same bit pattern of each set of group selection bits is associated with the constituent groups that are obtained from each other upon those phase rotations. The same bit pattern of each set of constituent signal point selection bits is associated with constituent signal points that are obtained from each other also upon those phase rotations.

Another general feature of the invention is a technique for estimating the most likely sequence of multi-dimensional signal points to have been sent, in which the distances between each received constituent signal (with dimensions fewer than that of the multi-dimensional constellation) and the nearest constituent signal points in the corresponding constituent subsets are determined, the distance between each received multi-dimensional signal and the nearest multi-dimensional signal point in each multi-dimensional subset is determined based on a combination of the distances with respect to constituent subsets corresponding to the multi-dimensional subset, and the most likely sequence is determined based on the distances between each received multi-dimensional signal and the nearest multi-dimensional signal point in each multi-dimensional subset.

Preferred embodiments include the following features. The distance between the received multi-dimensional signal and the nearest multi-dimensional signal point in each multi-dimensional subset is determined based on combining distances with respect to constituent subsets of each multi-dimensional type within the multi-dimensional subset, a multi-dimensional type being a concatenation of constituent subsets whose dimensions are fewer than that of the multi-dimensional constellation. The distances between each received two-dimensional signal and the nearest two-dimensional signal points in the corresponding two-dimensional subsets are determined, and the distance between each received constituent signal and the nearest constituent signal point in the corresponding constituent subset is based on a combination of the distances with respect to two-dimensional subsets corresponding to the constituent subset.

In another general feature of the invention, the multi-dimensional subsets comprise respectively a multi-dimensional lattice and translations of that lattice.

In preferred embodiments, the lattice comprises a multi-dimensional constellation of the type used in a block-coded modulation system.

In another general feature of the invention, the constituent 2D constellations are partitioned into more than four constituent subsets.

Other preferred embodiments of the general features of the invention include the following features. Each constituent 2D constellation is divided into two groups. The multi-dimensional constellation excludes some multi-dimensional signal points which are concatenations of signal points belonging to constituent 2D constellations, the multi-dimensional signal points which are excluded being based on the groups to which the constituent signal points belong. All of the constituent subsets for each constituent 2D constellation have the same numbers of constituent signal points in each group. Each group is invariant under a phase rotation corresponding to an ambiguity of the constituent constellation. One group is divided into subgoups that are rotationally invariant under those phase rotations. All of the constituent subsets for each constituent 2D constellation have the same mumbers of constituent signal points in each subgroup. There are N constituent 2D constellations and the groups in each constituent 2D constellation include a first group that has N times as many signal points as the second group. The first group is divided into N subgroups. The excluded multi-dimensional signal points correspond to more than one constituent signal point in the second group. The multi-dimensional constellation has 2N dimensions, N being a power of two (e.g., 2, 4, or 8). The constituent constellations include a 2N-dimensional constellation, N being a power of two. The number of multi-dimensional subsets is fewer than $4^N$ where 2N is the number of dimensions of the multi-dimensional constellation. There are 8, 16, or 32 multi-dimensional subsets (for N=2, 4, 8, respectively). The number of multi-dimensional subsets is fewer than $8^N$ where 2N is the number of dimensions of the multi-dimensional constellation. There are 32 multi-dimensional subsets (N=2). The minimum distance within the multi-dimensional constellation is smaller than the minimum distance within each multi-dimensional subset. The constituent constellations are all two-dimensional constellations. The constituent constellations are all four-dimensional constellations. The minimum distance within each constituent constellation is smaller than the minimum distance within each constituent subset. The phase ambiguity amounts include 90°, 180°, and 270°. There are 8 constituent 2D subsets. The multi-dimensional constellation has 4 or 8 dimensions and the convolutional coder has respectively 16 states or 64 states. There are multi-dimensional families that comprise multi-dimensional subsets such that the minimum distance within each family is greater than the minimum distance within the multi-dimensional constellation, and the information bits are encoded on the basis of the families. The multi-dimensional families comprise multi-dimensional subfamilies such that the minimum distance within each subfamily is greater than the minimum distance within each family. Q information bits appear in each signaling slot, Q being an integer (e.g., 7) or a non-integer (e.g., $6\frac{1}{8}$, $5\frac{1}{4}$, or $4\frac{3}{8}$). The groups comprise inner and outer groups requiring respectively different average powers. The signaling slots correspond to successive signaling intervals. The convolutional coder which is immune to 90° phase rotations is a linear convolutional coder. The constituent 2D constellations are portions of the rectangular lattice. The convolutional coder adds one redundant bit.

The invention achieves relatively good coding gains in the minimum distance between allowed sequences of signal points, relatively small multiplicities of error events with the minimum distance, and transparency to phase rotations of signal constellations, with an acceptable peak-to-average power ratio. The constituent 2D constellations are relatively small, implying simpler receiver design and better performance. The multi-dimensional signal mapping is converted by the bit converter and block encoder into multiple two-dimensional mappings, which enables the repeated use of very short mapping tables in the transmitter and the receiver. Grouping the multi-dimensional types or subtypes into multi-dimensional subsets makes possible the design of simple and powerful codes and reduces the decoder complexity by reducing the number of state transitions leading to each state. The computation of trellis branch metrics at the decoder can proceed in stages by determining the branch metrics for constituent subsets and combining them to obtain the multi-dimensional branch metrics. In some embodiments, the design of the convolutional code need not consider phase rotations of signal constellations.

In transmitting 7 information bits per signaling slot, the 16-state, 4D system achieves a coding gain of 4.66 dB (in the minimum distance) over an uncoded system using a 128-point 2D cross constellation. The multiplicity of the error event with the minimum distance (the number of nearest neighbors) is 12. The peak-to-average power ratio is 2.16. The constituent 2D constellation has 192 points. The code is transparent to 90°, 180°, and 270° phase ambiguities. By comparison, for the best known 8-state, 2D code, the coding gain is 4.01 dB in the minimum distance, the multiplicity of the error event with the minimum distance is 16, the peak-to-average power ratio is 1.93, and the 2D constellation has 256 points. Theoretically, both larger coding gain and smaller multiplicity of the error event with the minimum distance of the 4D code imply better performance over the 2D code. Furthermore, the larger coding gain of the 4D code is not obtained at the cost of increasing the peak-to-average power ratio to an unacceptably large value. It is important to keep this ratio small because the transmission medium may distort the transmitted signal nonlinearly. The smaller 2D constellation for the 4D code than for the 2D code implies simpler receiver design and better performance when the received signal contains signal-dependent noise. The 4D code is less complicated than known 8-state 2D codes.

The 64-state, 8D code achieves a coding gain over the encoded case of 5.41 dB in the minimum distance. The multiplicity of the error event with the minimum distance is 60. The peak-to-average power ratio is 2.14. The code is transparent to 90°, 180°, 270° phase ambiguities. The constituent 2D constellation has 160 points. As a comparison, the coding gain of the best known 32-state, 2D code is 4.80 dB in the minimum distance. The multiplicity of the error event with the minimum distance is 16. The peak-to-average power ratio is 1.93. The 2D constellation has 256 points. Theoretically, although the 8D code has a larger multiplicity of the error event with the minimum distance, the effect of this larger multiplicity is more than compensated by the larger coding gain in the minimum distance of the 8D code. As for the 4D codes, the larger coding gain of the 8D code is not obtained by increasing the peak-to-average power ratio to an unacceptably large value. The 8D code has a 2D constellation which is even smaller than for the 4D code, implying further improvement in the performance of the 8D code over the 4D and 2D codes. Transparency of the 8D code to 90-degree phase ambiguities gives immunity to rapid carrier phase changes. The 64-state, 8D code is less complicated than the 32-state, 2D code, and is less than twice as complicated as the 8-state, 2D code.

The 64-state, 4D code achieves 5.63 dB coding gain in the minimum distance over the uncoded case. The multiplicity of the error event with the minimum distance is 72 and the code is transparent to all 90-degree phase ambiguities.

Other advantages and features will become apparent from the following description of the preferred embodiment, and from the claims.

DESCRIPTION OF THE PREFERRED EMBODIMENTS

We first briefly describe the drawings.

Drawings

Figure 1:
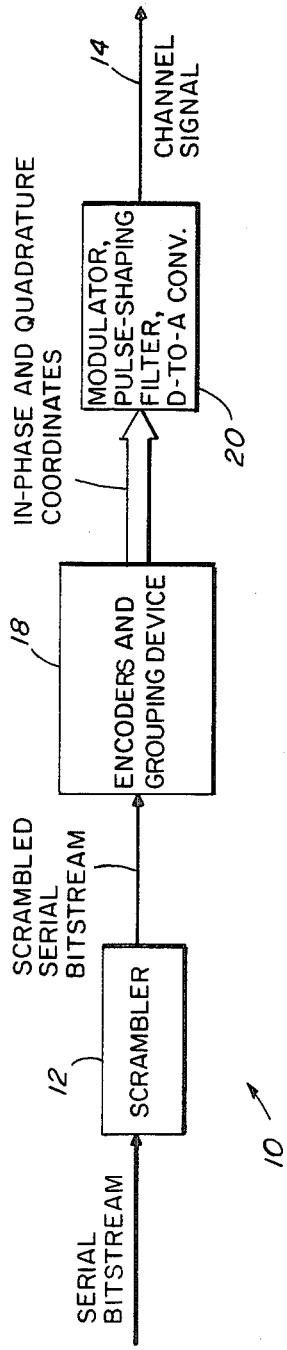
Figure 2:
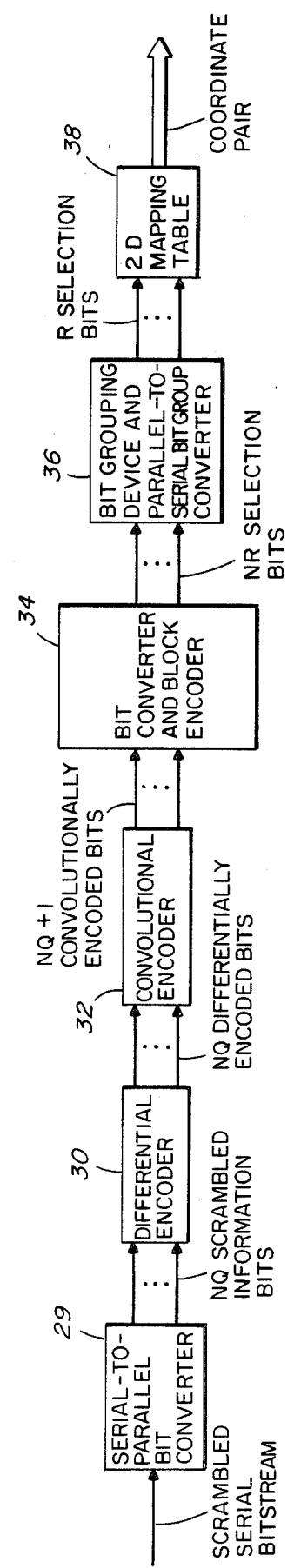
Figure 3:
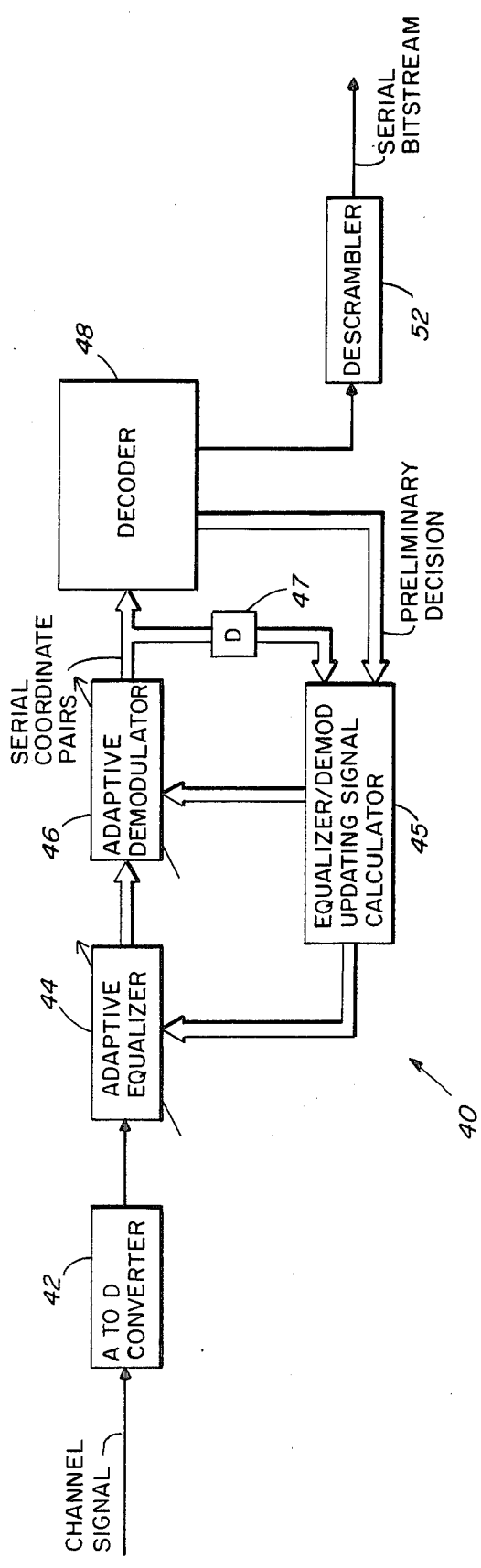
Figure 4:
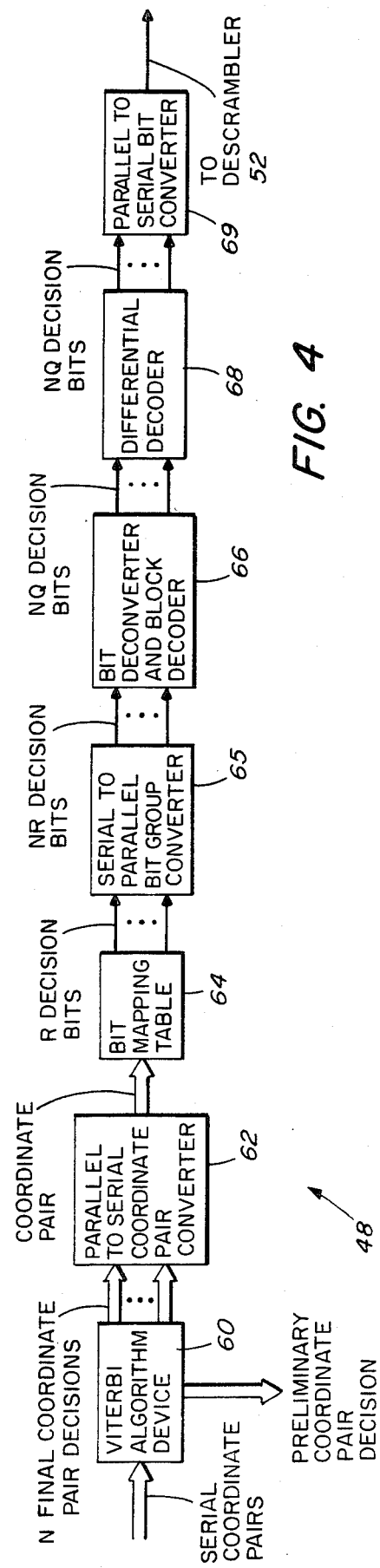
Figure 5:
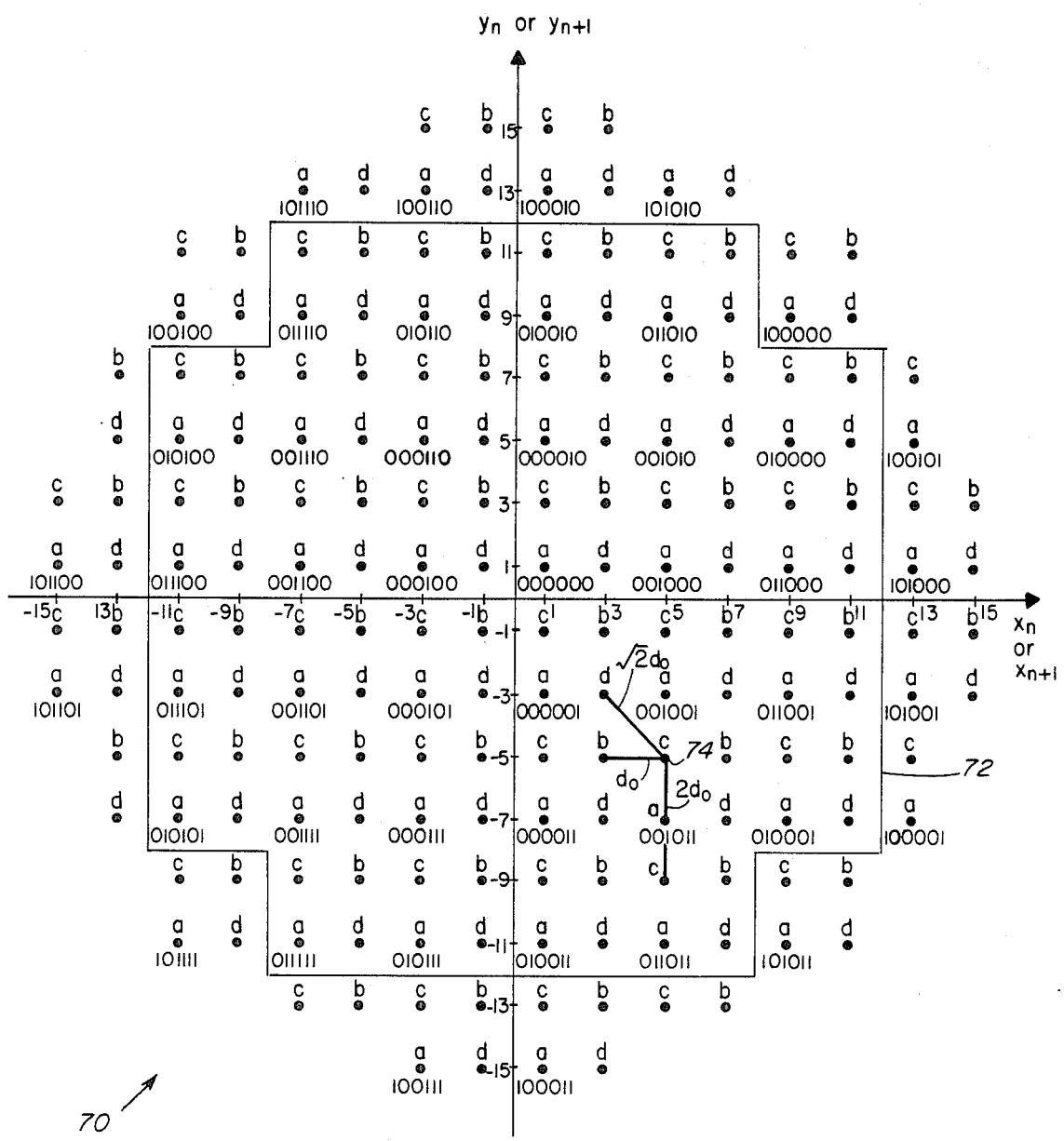
Figures 6, 7:
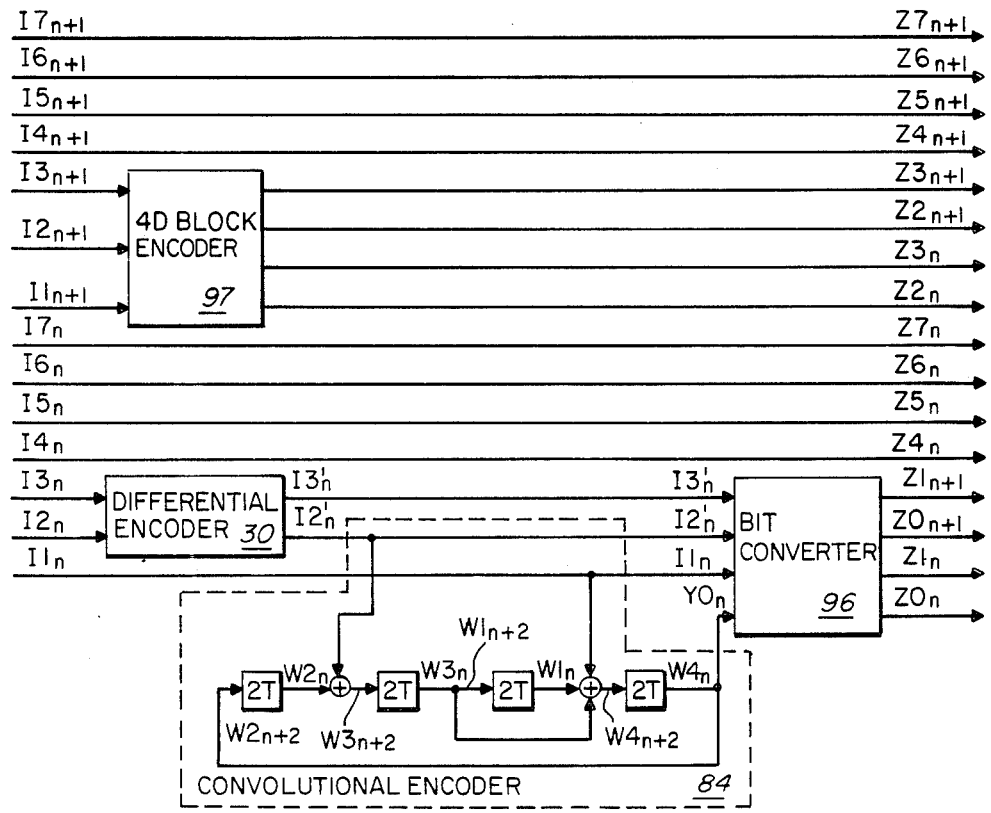
Figures 8, 9:
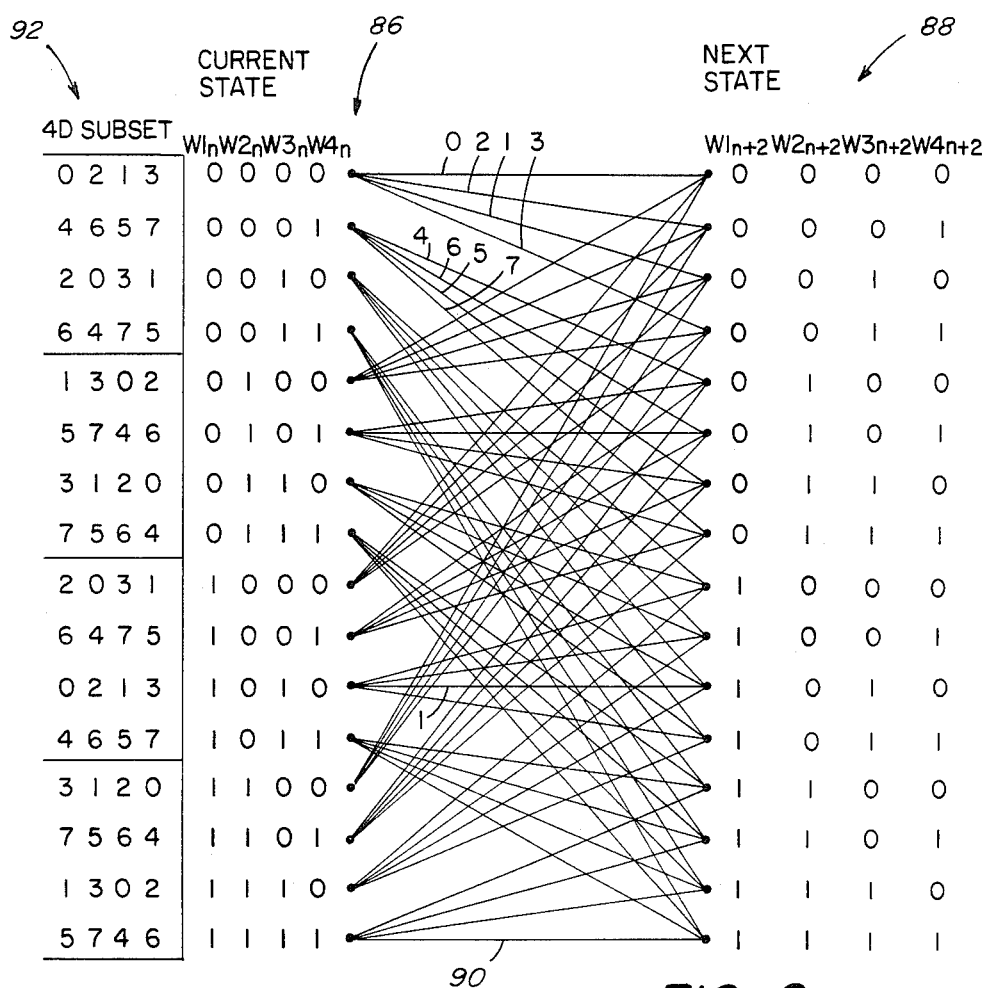
Figure 10:
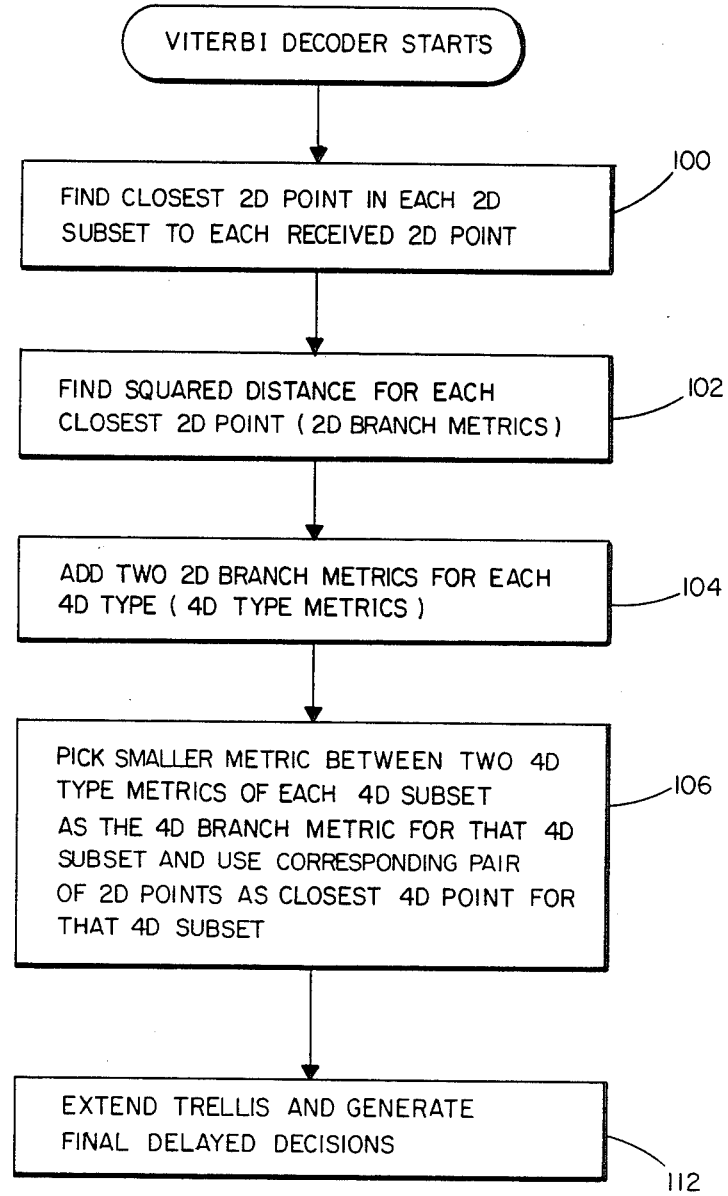
Figure 11:
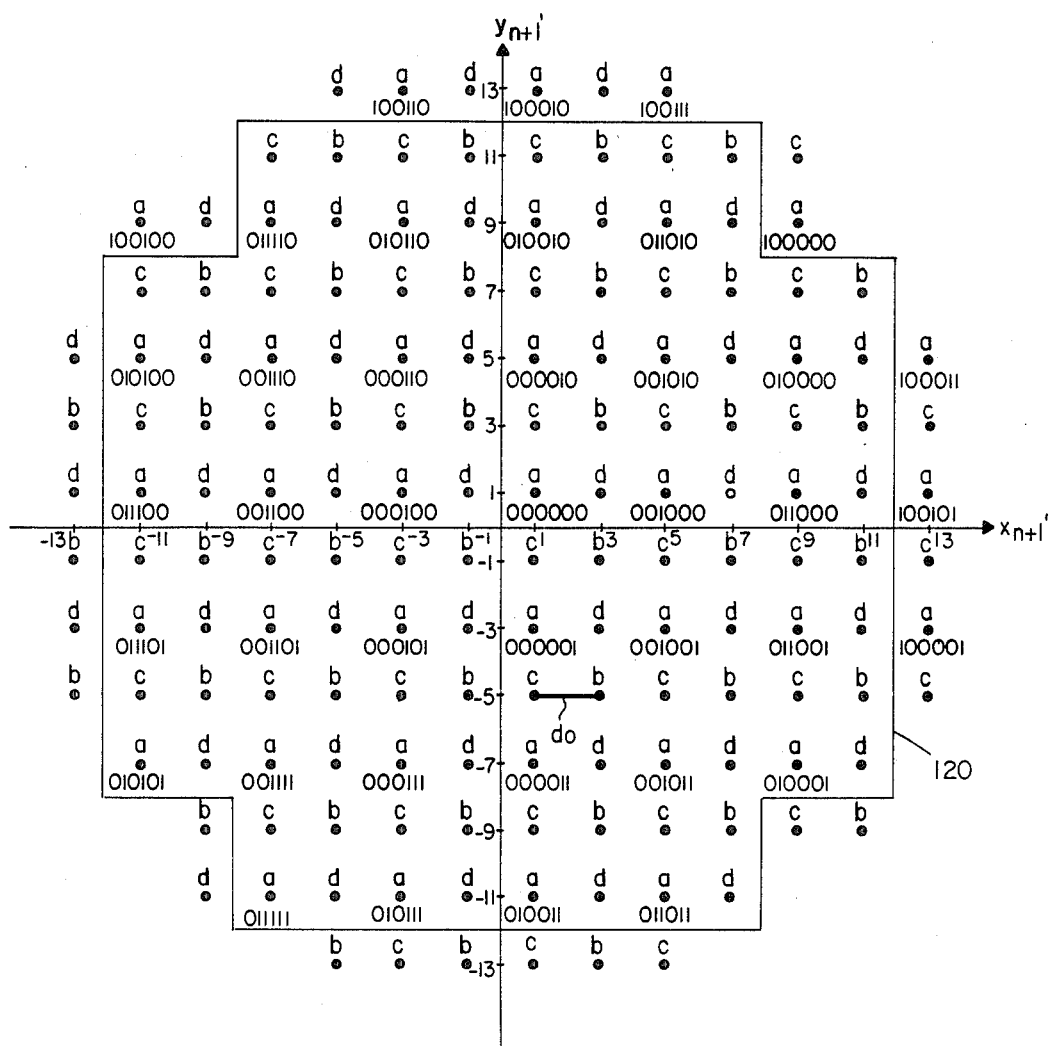
Figure 13:
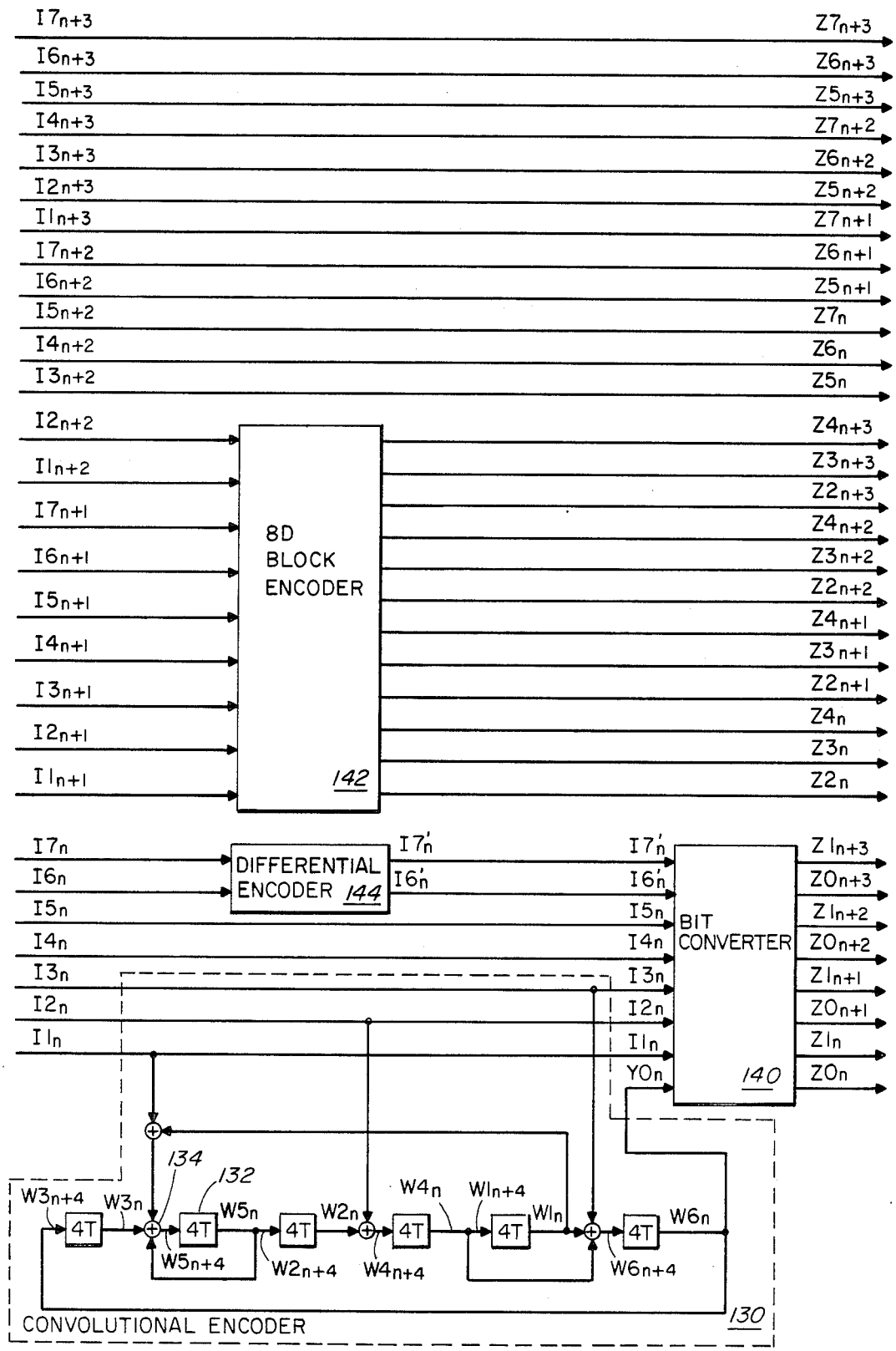
Figure 16:
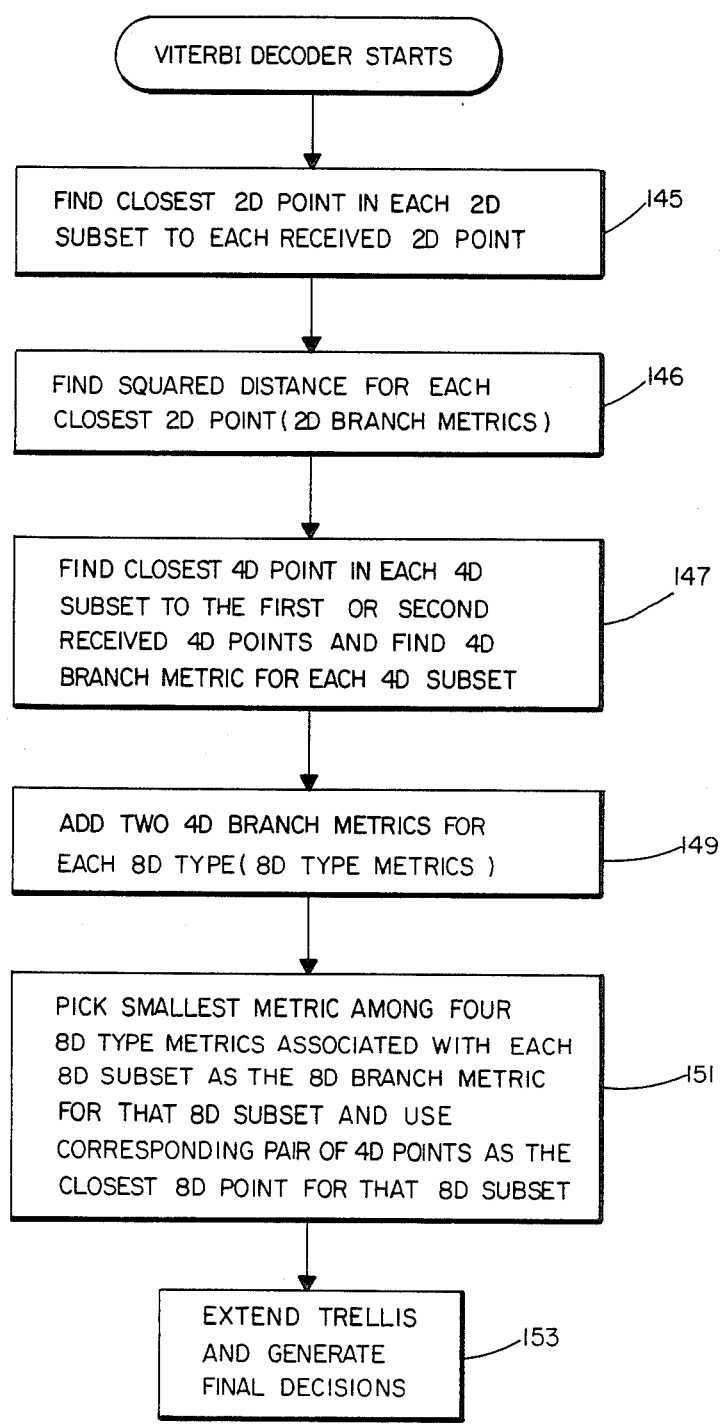
Figure 17:
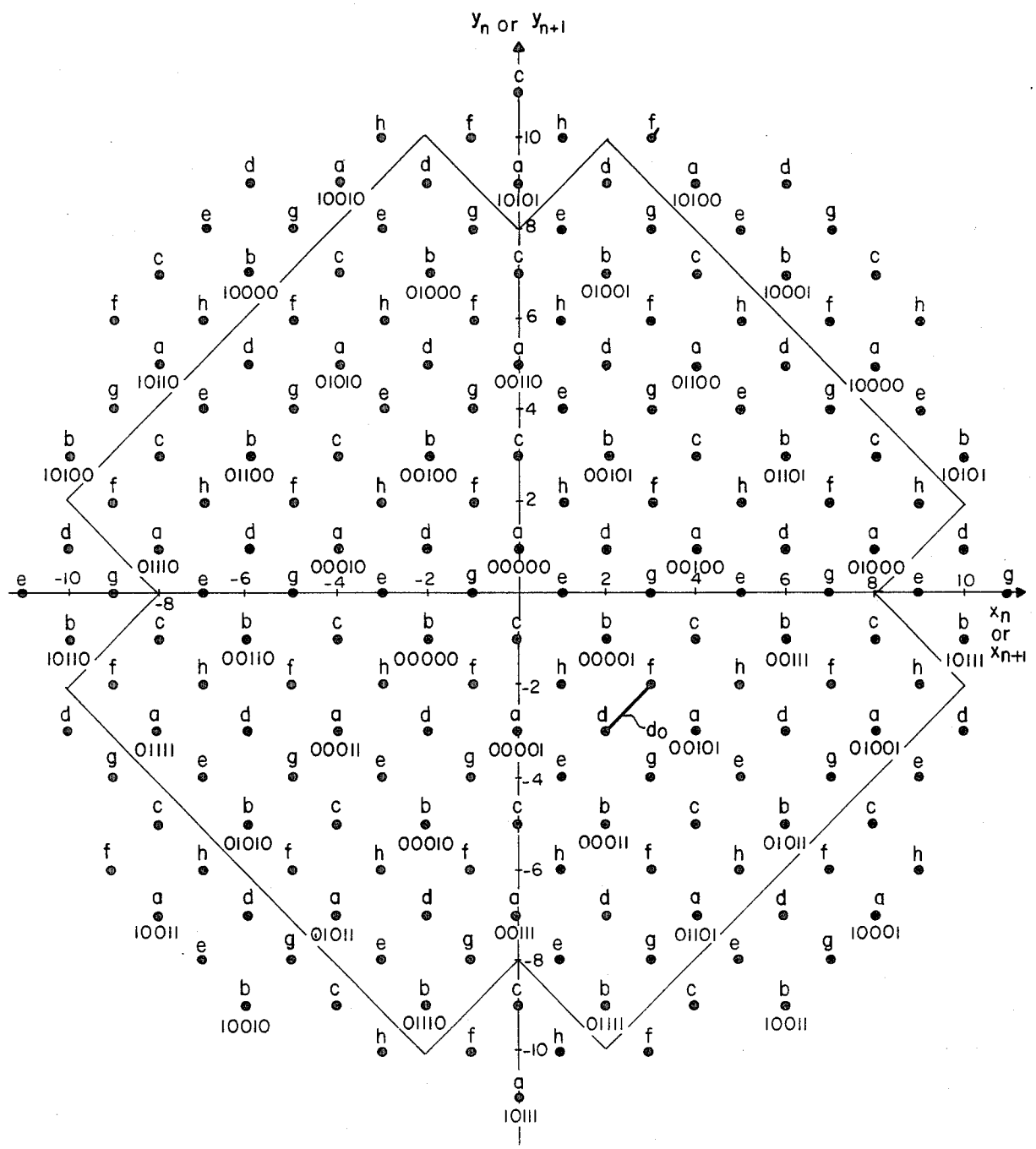
Figure 19:
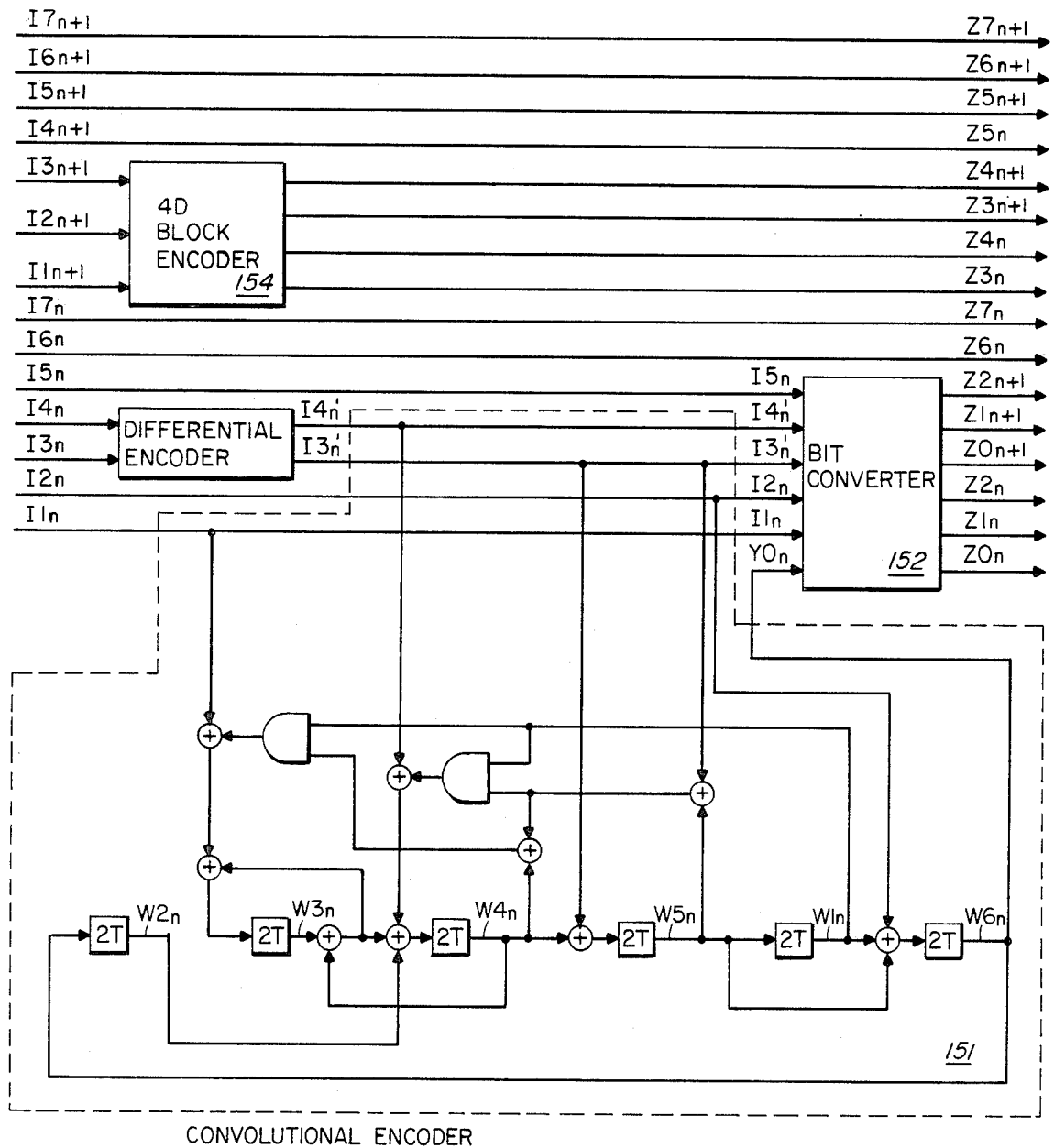
Figure 20:
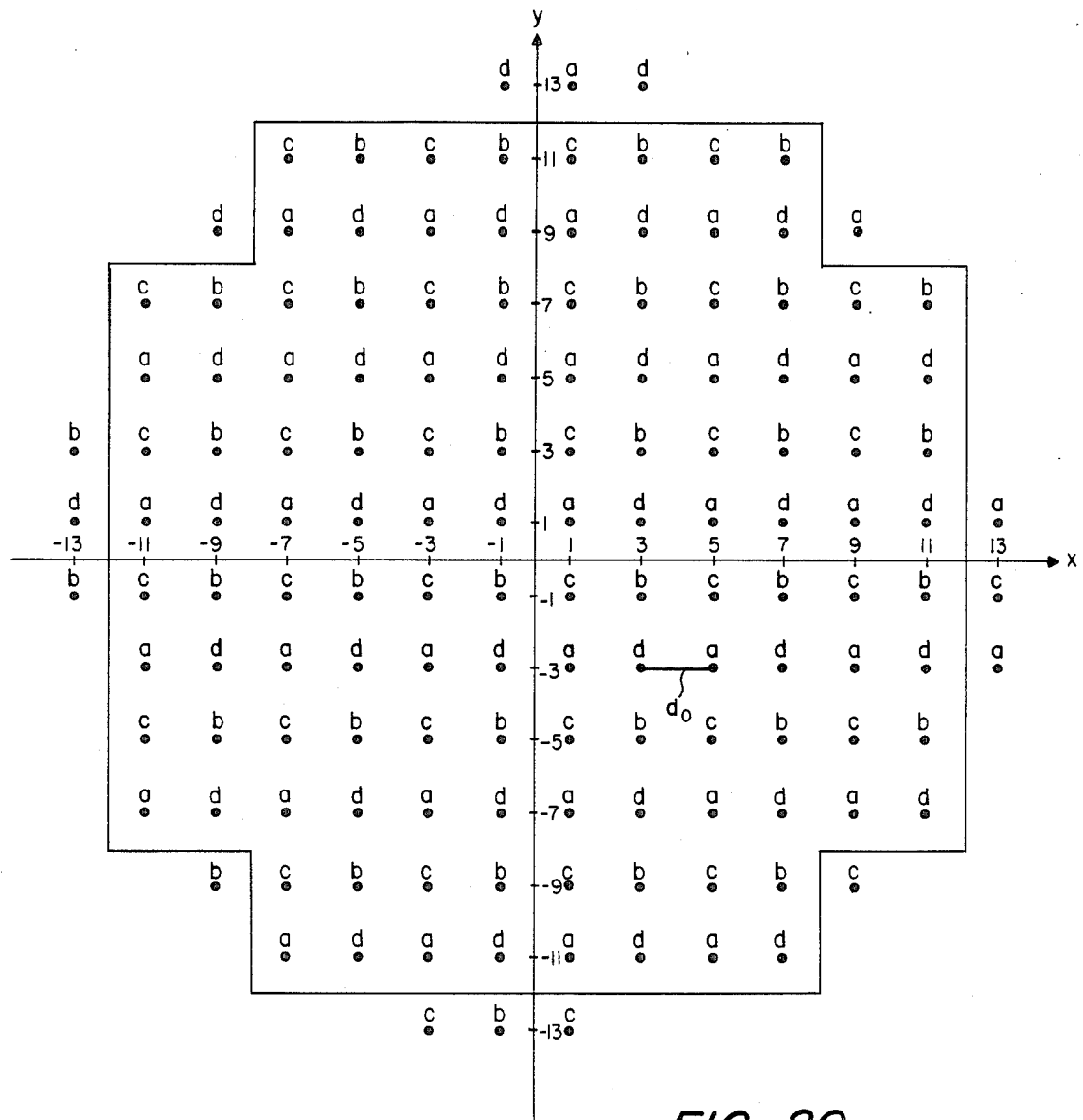

FIG. 1 is a block diagram of a transmitter.
FIG. 2 is a block diagram of the encoders and grouping device of FIG. 1.
FIG. 3 is a block diagram of a receiver for use with FIG. 1.
FIG. 4 is a block diagram of the decoder of FIG. 3.
FIG. 5 is a 192-point signal constellation.
FIG. 6 is a chart of 4D subsets and corresponding bit patterns.
FIG. 7 is a block diagram of the encoders of FIG. 2 for a 16-state, 4D code.
FIG. 8 is a trellis diagram for the 16-state, 4D code.
FIG. 9 is a bit chart representing the functions of the block encoder of FIG. 7.
FIG. 10 is a flow chart of the Viterbi algorithm for the 4D code.
FIG. 11 is a 160-point signal constellation.
FIGS. 12A & B are a chart of 8D subsets, and a bit conversion procedure.
FIG. 13 is a block diagram of the encoders of FIG. 2 for a 64-state, 8D code.
FIGS. 14A & B are a trellis table for the 64-state, 8D code.
FIG. 15 is a description of the output bits of the block encoder of FIG. 13.
FIG. 16 is a flow chart of the Viterbi algorithm for the 8D code.
FIG. 17 is a 192-point signal constellation partitioned into eight subsets.
FIG. 18 is a chart of 32 4D subsets.
FIG. 19 is a block diagram of the encoders of FIG. 2 for a 64-state, 4D code.
FIG. 20 is a 144-point signal constellation.
FIGS. 21A & B are a chart of 32 16D subsets.

Structure and Operation

Referring to FIG. 1, in transmitter 10 a scrambler 12 receives a serial bitstream of information to be sent over a channel 14. The scrambled information bits are then delivered to encoders and grouping device 18 at a rate of Q bits per signaling interval (for example, Q=7 bits per signaling interval). Thus, the bits appearing at the input of encoders and grouping device 18 with respect to a given signaling interval (for example, the nth signaling interval) can be denoted $I1_n$ through $IQ_n$. Based on the information bits appearing with respect to a block of some number N (for example, N=2), of successive signaling intervals (that is the information bits $I1_m$ through $IQ_m$, for m=n, n+1, ..., n+N−1), the encoders and grouping device 18 deliver to modulator 20 N pairs of in-phase and quadrature coordinates in series, one pair in each signaling interval, each pair corresponding to a point in a two-dimensional (2D) signal constellation. These pairs of coordinates are then used in modulator 20 to modulate a carrier. The modulated carrier is then pulse-shape filtered, and then D-to-A converted to an analog signal for transmission over channel 14, as in a conventional Quadrature-Amplitude-Modulated (QAM) carrier system.

Referring to FIG. 2, encoders and grouping device 18 include a serial-to-parallel bit converter 29 which groups the incoming scrambled serial bitstream into blocks of NQ scrambled information bits and sends each block of NQ bits in parallel to differential encoder 30. The differentially encoded information bits are then passed through a convolutional encoder 32 which adds one redundant bit indicative of the current state of a finite state device represented by the convolutional encoder. The convolutionally encoded bits are then passed through a bit converter and block encoder 34. The block encoder encodes some of the input bits and adds N−1 additional bits; and the bit converter converts a set of bits into an equal number of bits in a manner to be described below.

The output bits of the bit converter and block encoder 34 are a set of NR point selection bits, where R is an integer equal to Q+1 (because bits have been added by the convolutional encoder and the block encoder). A bit grouping device and parallel to serial bit group converter 36 then organizes the NR coded bits into N groups denoted as $Z0_m$ through $ZQ_m$, m=n,n+1, ..., n+N−1 and delivers one group in each signaling interval to a 2D mapping table 38. For each combination of bits in a group, table 38 contains the corresponding pair of modulation coordinates which are then delivered to modulator 20 (FIG. 1).

Because the next state of the finite state device represented by the convolutional encoder depends both on its current state and on the current information bits, the output bits of the convolutional encoder (and hence the transmitted signals) carry historical information about the sequence of information bits being sent. This historical information is exploited at the receiver end of channel 14.

Differential encoding removes the phase ambiguities of the signal constellations.

Convolutionally encoding NQ bits at one time adds only one redundant bit (instead of N) per N signaling intervals, thus achieving additional coding gain. The block encoder and bit converter, while adding an additional N−1 bits per N signaling intervals, retain almost all the coding gain achieved by the convolutional encoding, and convert the multidimensional signal constellation mapping into N two-dimensional signal constellation mappings.

Referring to FIG. 3, in receiver 40, the received modulated carrier channel signal is passed through an A-to-D converter 42, an adaptive equalizer 44, and an adaptive demodulator 46. Equalized and demodulated coordinate pairs are delivered serially from demodulator 46 to a decoder 48. Decoder 48 feeds back preliminary decisions on the received coordinate pairs to equalizer/demodulator updating signal calculator 45. These preliminary decisions are processed in calculator 45 in a conventional manner to generate updating signals for the equalizer and demodulator, as disclosed in Falconer, "Jointly Adaptive Equalization and Carrier Recovery in Two-Dimensional Digital Communication Systems", Bell System Technical Journal, pp. 317-334, March, 1976. The preliminary decisions may be delayed. In that case, the demodulator output will be delayed accordingly by delay element 47 before it is sent to calculator 45. Decoder 48, after a delay of a number of signaling intervals, also delivers to descrambler 52 final decisions of scrambled information bits which were sent. The output of descrambler 52 is the original serial bitstream.

Referring to FIG. 4, in decoder 48 the serial coordinate pairs are delivered to a Viterbi algorithm device 60 which feeds back the preliminary decisions to the equalizer and demodulator and after some delay delivers N final coordinate pair decisions in parallel for every block of N signaling intervals. Converter 62 applies one coordinate pair in each signaling interval to a bit mapping table 64. For each block of N coordinate pairs applied to table 64, the corresponding N groups of R decision bits are grouped together in serial-to-parallel group converter 65 and delivered to a bit deconverter and block decoder 66 and then to a differential decoder 68. The deconverter and decoder perform reverse conversion and decoding from those performed at the transmitter. A parallel-to-serial bit converter 69 then provides the original scrambled information bitstream to the descrambler 52.

Using convolutional encoders having selected numbers of states operating on selected numbers N of signaling intervals worth of information bits at a time, coding structures having different desired properties can be attained.

The transmitter and receiver are implemented by programming a microprocessor and two signal processors interconnected in the way disclosed in U.S. patent application Ser. No. 586,681, filed March 6, 1984, incorporated herein by reference.

16 State, Four-Dimensional (4D) Code

For example, to send 7 bits per signaling interval using a 16-state, 4D code (that is, one which handles two signaling intervals worth of information bits at one time), the transmitter 10 takes the fourteen information bits which appear in two successive signaling intervals and encodes them into two 2D signal points drawn from a 2D constellation having 192 points.

FIG. 5 shows how the 2D constellation 70 is constructed and partitioned. The 2D constellation includes the same 128-point cross constellation 72 (located within the boundary shown) which is typically used with a non-channel-coded system for sending 7 bits per signaling interval (Q=7). Those 128 points (indicated as dots) within the boundary are called inner group points. The 2D constellation also includes an outer group of 64 points, half as many points as are in the inner group. The outer group points are selected from the points lying on the extension of the inner group rectangular grid to regions beyond the boundary of the 128-point cross constellation. The outer group points are arranged as close to the origin as possible. Furthermore, if the 2D constellation is rotated by 90°, 180°, or 270° about the origin, each outer group point falls on another outer group point. And the same property holds true for the inner group points. (The 2D constellation as a whole is characterized by phase rotational ambiguities of 90°, 180°, 270°; that is if the pattern of 2D signal points in the constellation is rotated by amounts corresponding to those ambiguities, the same pattern of 2D signal points is obtained.)

The 192-point 2D constellation is partitioned into four equal-sized subsets, denoted A, B, C, and D. In FIG. 5, the subset to which each point belongs is indicated by a corresponding lower case letter, a, b, c, or d. The subsets are grouped into two 2D families, denoted AUB (the union of A with B) and CUD. All subsets have the same numbers of inner group points and outer group points. The ratio of the number of outer group points to the number of inner group points in each subset is thus the same as the ratio for the entire 2D constellation. The minimum squared distance, $4d_0^2$, between points belonging to the same subset is greater than the minimum squared distance, $2d_0^2$, between points belonging to different subsets within the same 2D family, which is in turn greater than the minimum squared distance $d_0^2$, between any two points. (Examples of such distances are shown with reference to point 74 on FIG. 5.)

In the constellation of FIG. 5, the 2D points of subset A are labeled with a six-bit value representing a bit pattern $Z2_{n+i}Z3_{n+i}Z4_{n+i}Z5_{n+i}Z6_{n+i}Z7_{n+i}$ (i=0 or 1).

The same bit pattern of a point in subset A is assigned to each of the three 2D points which can be obtained from the given point in subset A by 90° rotations.

Two identical such 2D constellations taken together can be conceived as the constituent constellations of a single 4D constellation having 36864 ($=192 \times 192$) 4D points, the four coordinates of each 4D point being the same as the two pairs of coordinates of the corresponding pair of 2D points, one from each 2D constellation. Only 32768 ($=2^{15}$) of the 36864 4D points will be used, namely the ones whose corresponding pair of 2D points do not both belong to the outer group. From now on, in discussing the 16-state code for transmitting 7 bits per signaling interval, we will refer to this 32768-point 4D constellation as the 4D constellation. The average energy per signaling interval for the 4D constellation can be shown to be $28.0625d_0^2$. Since the peak energy per signaling interval is $60.5d_0^2$, the peak-to-average power ratio is 2.16, smaller than the peak-to-average power ratio, 2.33, for the 64-point rectangular 2D constellation commonly used in a non-channel coded system for sending 6 bits per signaling interval.

We now define 16 ($=4\times4$) 4D types, each corresponding to a concatenation of a pair of 2D subsets, and denoted as (A,A), (A,B), ..., and (D,D). Each 4D type has 2048 points and the minimum squared distance between two 4D points belonging to the same type is $4d_0^2$, which is the same as the minimum squared distance between two 2D points belonging to the same 2D subset. (The squared distance between two 4D points is simply the sum of the squared distances with respect to the two pairs of 2D points to which those two 4D points correspond.) Note also that each 4D type, like the 4D constellation, contains only 4D points for which the corresponding pair of 2D points do not both belong to the outer groups of the 2D subsets corresponding to that 4D type.

Referring to FIG. 6, the 4D types are paired to form eight 4D subsets, denoted as 0, 1, 2, ..., and 7 (see cols. 80, 82 of FIG. 6). The pairing, while yielding only half as many 4D subsets as 4D types, is done in a way which maintains the same minimum squared distance ($4d_0^2$) between two 4D points within each 4D subset as exists between two 4D points within each 4D type. Two advantages of pairing are that with fewer 4D subsets, the design of a simple and powerful convolutional code is made easier, and the decoder complexity is reduced.

The way that 4D subsets are formed is as follows.

The two first 2D subsets associated with the two 4D types in each 4D subset span either the first 2D family AUB or the second 2D family CUD, and likewise for the two second 2D subsets associated with that 4D subset. Thus, because the minimum squared distance between two 2D points belonging to different 2D subsets within the same 2D family is $2d_0^2$, the minimum squared distance between two 4D points belonging to the same 4D subset is $4d_0^2$. The eight 4D subsets are themselves grouped into two 4D families, denoted as 0U1U2U3 and 4U5U6U7.

The two first and two second 2D subsets associated with each 4D subset in the first 4D family 0U1U2U3 span the same 2D family AUB or CUD, and in the second 4D family the two first and two second 2D subsets associated with each 4D subset span different 2D families. Because the minimum squared distance between two points belonging to different 2D subsets within the same 2D family is $2d_0^2$, and the minimum squared distance between two 2D points belonging to different 2D subsets of different 2D families is $d_0^2$, the minimum squared distance between two 4D points belonging to different 4D subsets within the same 4D family is $2d_0^2$, and the minimum squared distance between two 4D points belonging to different 4D subsets of different 4D families is $d_0^2$. Furthermore note that if a 4D subset is rotated about the origin by 90° clockwise, another 4D subset is obtained. And if a 4D subset is rotated by 180° the same 4D subset is obtained.

The design of a 16-state, 90-degree rotationally invariant linear convolutional code with these eight 4D subsets is illustrated in FIGS. 6 and 7. (A code is described as 90-degree rotationally invariant if it is transparent to all 90, 180 and 270-degree phase ambiguities of the signal constellation.)

A rate $\frac{2}{3}$, 16-state linear convolutional encoder 84 is used to generate three bits ($Y0_n$, $I1_n$, and $I2_n'$) needed to specify the 4D subset from which a 4D point is to be drawn. The bit patterns in the $Y0_n$, $I1_n I2_n'$ columns of FIG. 6 correspond to the decimal number for each subset. (Note that convolutional encoder 84 is intended to be the portion of convolutional encoder 32 (FIG. 2) that convolutionally encodes certain bits.)

In convolutional encoder 84, each box marked 2T (FIG. 7) represents a temporary storage element which holds any input value for two signaling intervals; the value held in the element always appears at its output. The circles marked "plus" are logical exclusive or elements. The outputs of the 2T elements are bits marked $W1_n$, $W2_n$, $W3_n$, and $W4_n$ which together comprise the current state of the finite state device represented by encoder 84. The inputs of the 2T elements are bits marked $W1_{n+2}$, $W2_{n+2}$, $W3_{n+2}$, and $W4_{n+2}$ which together comprise the next state of encoder 84.

Only certain sequences of state transitions of the convolutional encoder are allowed as represented by the branches in the trellis diagram of FIG. 8.

In FIG. 8, the 16 possible current states are represented by a column of dots 86 each marked (to the left of the dot) with the corresponding pattern of state defining bits. The 16 possible next states are represented by column 88. Trellis branches 90 connecting current states to next states represent allowed state transitions. Each state can be followed by only four possible transitions, and can result from only four possible transitions. Each transition has a 4D subset assigned to it. The assignments for transitions from each current state are represented by the 4D subset numbers appearing in column 92 to the left of that state. For example, the transitions from current state 0000 are assigned 4D subsets 0 2 1 3 respectively as shown. The assignment satisfies the following three rules:

(1) The 4D subsets assigned to the transitions leading from a state are all from the same 4D family, and likewise for the 4D subsets associated with the transitions leading to a state.

(2) The minimum squared distance between two allowed sequences of 4D points corresponding to two distinct trellis paths is larger than the minimum squared distance between two 4D points within a 4D subset. For example, this rule is satisfied by the following approach, referring to FIGS. 7, 8(a) for each current state $W1_n W2_n W3_n W4_n$, the four possible next states are $W3_n W4_n X1 X2$, where $X1X2=00, 01, 10$, and 11. (b) All transitions originating from even-numbered states (states with $W4_n$ equal to 0) are assigned 4D subsets from the first 4D family 0U1U2U3. (c) All transitions originating from odd-numbered states (states with $W4_n$ equal to 1) are assigned 4D subsets from the second 4D family 4U5U6U7. (d) If Y is the 4D subset assigned to the transition from the current state $W1_nW2_nW3_nW4_n$ to an even-numbered (or odd-numbered) next state, then Y is also the 4D subset assigned to the transition from the current state $W1_nW2_n\overline{W3}_nW4_n$ to an odd-numbered (or even-numbered) next state, where "-" appearing over a letter denotes an inversion.

(3) For each transition from a current state $W1_nW2_nW3_nW4_n$ to an allowed next state $W1_{n+2}W2_{n+2}W3_{n+2}W4_{n+2}$, if X denotes the 4D subset assigned to this transition, and if Y denotes the 4D subset obtained when the 4D subset X is rotated 90 degrees clockwise, then Y must be assigned to the transition from the current state $\overline{W1}_nW2_n\overline{W3}_nW4_n$ to the next state $\overline{W1}_{n+2}W2_{n+2}\overline{W3}_{n+2}W4_{n+2}$. For example, if 4D subset 0 is assigned to the transition from state 0000 to state 0000, then 4D subset 1 must be assigned to the transition from state 1010 to state 1010.

The first rule guarantees that the minimum squared distance between any two allowed sequences of 4D points is $4d_0^2$. The coding gain (in terms of the minimum distance) of the code over the uncoded 128-point 2D cross constellation therefore is $$10 \log_{10} \frac{\frac{4d_0^2}{28.0625d_0^2}}{\frac{d_0^2}{20.5d_0^2}} = 4.66 \text{ dB}$$

where $d_0^2$ is the minimum squared distance between two 2D points of the 128-point 2D cross constellation, and $20.5d_0^2$ is the average energy per signaling interval of the 128-point 2D cross constellation.

The second rule eliminates minimum squared distance error events which differ in more than one 4D point from a given sequence of 4D points, thus reducing the multiplicity of minimum squared distance error events to 24 per 4D point (or equivalently, 12 per 2D point), which is, in this case, also the number of 4D points at squared distance $4d_0^2$ from a given 4D point in the same 4D subset.

The third rule guarantees that the code can be made transparent to all 90-degree rotations of the received signal. Since the same 4D subset is obtained when a 4D subset is rotated by 180 degrees, the design of a rotationally invariant convolutional code needs to take into account only 90-degree rotation. A linear convolutional code is thus sufficient to accomplish transparency to all 90-degree rotations.

We now describe how to map the three output bits of the convolutional encoder and the twelve remaining uncoded information bits into the 4D constellation. Four coordinate values are needed to define each 4D point; therefore a straightforward mapping would require a table of 131072 ($=2^{15} \times 4$) coordinate values. Even when all the symmetries of the 4D constellation are exploited to reduce the number of coordinate values, a table of 8192 ($=2^{11} \times 4$) coordinate values would still be required. However, the invention allows this table to be reduced to only 384 ($=192 \times 2$) coordinate values, and further reduced to 96 ($=48 \times 2$) when all the symmetries of the constellation are exploited, permitting a substantial saving of hardware capacity.

Referring again to FIGS. 6 and 7, after using the three output bits of the convolutional encoder to specify a 4D subset, a fourth non-convolutionally-coded information bit ($I3_n'$) is used to specify a 4D type within the 4D subset. To make the code transparent to 90° phase ambiguities, the association of the three convolutionally coded bits $Y0_n, I1_n, I2_n'$ and the fourth uncoded bit $I3_n'$ with 4D types is done as follows. For each pattern of $Y0_nI1_nI2_n'I3_n'$, denote X as the associated 4D type. Denote $Y_1, Y_2, Y_3$ as the 4D types obtained when the 4D type X is rotated by 90°, 180°, and 270° clockwise, respectively. Denote $S3_1S2_1, S3_2S2_2,$ and $S3_3S2_3$ as the bit pairs obtained when the bit pair $I3_n'I2_n'$ is advanced by one, two, and three positions, respectively, in a circular sequence 00, 01, 10, 11. Then the 4D types associated with the bit patterns $Y0_nI1_nS2_1S3_1, Y0_nI1_nS2_2S3_2$ and $Y0_nI1_nS2_3S3_3$ are $Y_1, Y_2,$ and $Y_3$, respectively.

As a first step of the mapping, a bit converter 96 converts the four bits ($Y0_nI1_nI2_n'I3_n'$) into two pairs of selection bits, $Z0_nZ1_n$ and $Z0_{n+1}Z1_{n+1}$, which are used to select the pair of 2D subsets corresponding to the 4D type. (Note that bit converter 96 is intended to be the portion of the bit converter and block encoder 34 (FIG. 2) that performs the bit conversions.) In this code, each pair of selection bits corresponds to a 2D subset in accordance with the following table:

| 2D Subset | $Z0_nZ1_n$ or $Z0_{n+1}Z1_{n+1}$ |
| --- | --- |
| A | 00 |
| B | 01 |
| C | 10 |
| D | 11 |

The eleven uncoded information bits which remain will be used to select a 4D point from the previously selected 4D type.

Referring to FIGS. 5, 7, and 9, a 4D block encoder 97 takes three of the remaining uncoded information bits ($I1_{n+1}, I2_{n+1},$ and $I3_{n+1}$) and generates two pairs of selection bits ($Z2_nZ3_n$ and $Z2_{n+1}Z3_{n+1}$). (Note that block encoder 96 is intended to be the portion of the bit converter and block encoder 34 (FIG. 2) that performs the bit conversion.) Each of the pairs of selection bits can assume any of the values 00, 01, or 10, but they cannot both assume the value 10. The first pair $Z2_nZ3_n$ will be used to select the inner group or outer group of the first 2D subset corresponding to the previously selected 4D type, likewise for the second pair $Z2_{n+1}Z3_{n+1}$ with respect to the second 2D subset. The inner group is organized into two halves called subgroups. If the pair of selection bits is 00, one of the halves of the inner group is selected; if the bits are 01, the other half of the inner group is selected; otherwise the outer group is selected.

There are 16 2D points in the outer group or in either half of the inner group of a 2D subset, and eight uncoded information bits remain for selecting from among those 2D points. Those eight bits are taken in two groups of four bits each, and are renamed as $Z4_nZ5_nZ6_nZ7_n$ and $Z4_{n+1}Z5_{n+1}Z6_{n+1}Z7_{n+1}$. The first group $Z4_nZ5_nZ6_nZ7_n$ will be used to select a 2D point from the previously selected outer group or the selected half of the inner group of the first 2D subset, and likewise for the second group $Z4_{n+1}Z5_{n+1}Z6_{n+1}Z7_{n+1}$.

Thus, the bit converter 96 and 4D block encoder 97 take the three output bits of the convolutional encoder and the twelve remaining uncoded information bits and produce sixteen point selection bits (R=8). Those sixteen selection bits are then grouped by grouping device 36 into two groups of eight selection bits each, $Z2_nZ3_nZ4_nZ5_nZ6_nZ7_nZ0_nZ1_n$ and $Z2_{n+1}Z3_{n+1}Z4_{n+1}Z5_{n+1}Z6_{n+1}Z7_{n+1}Z0_{n+1}Z1_{n+1}$. The first group $Z2_nZ3_nZ4_nZ5_nZ6_nZ7_nZ0_nZ1_n$ is then used to address a 2D mapping table 38, the table being constructed from the constellation of FIG. 5 simply by associating with the coordinates of each point the eight bits needed to represent the point (namely in the six bits marked under the point and the two bits $Z0_nZ1_n$ needed to specify the 2D subset), to obtain the pair of coordinates for the first 2D point corresponding to the 4D point defined by the three output bits of the convolutional encoder and the twelve remaining uncoded information bits. Likewise, the second group of selection bits addresses the same table 38 to obtain the coordinates of the second 2D point. Since each group of eight selection bits $Z2_mZ3_mZ4_mZ5_mZ6_mZ7_mZ0_mZ1_m$, when $m=n$ or $n+1$, can assume only 192 values (because $Z2_mZ3_m$ cannot be 11), the table has only $384(=192\times2)$ coordinate values. The table can be further reduced to only $96(=48\times2)$ coordinate values, since the same pattern of $Z2_mZ3_mZ4_mZ5_mZ6_mZ7_m$, for either $m=n$ or $n+1$, is associated with each of the four 2D points which can be obtained from each other by 90-degree rotations. In that case, the table provides the pair of coordinate values corresponding to $Z2_mZ3_mZ4_mZ5_mZ6_mZ7_m$ for a specific pattern of $Z0_mZ1_m$, $m=n$ or $n+1$. The pair of coordinate values corresponding to other patterns of $Z0_mZ1_m$ can be obtained through 90-degree rotations of the pair of coordinates obtained for the specific pattern of $Z0_mZ1_m$.

The last technique also enables making the code transparent to 90-degree rotations of the constellation (of the kind which may be caused by phase hits in the channel), which is accomplished as follows.

Referring to FIGS. 6 and 7, note that if we translate a sequence of the bit pairs $I3_n'I2_n'$ appearing at the inputs of the convolutional encoder and bit converter all by the same number of position—one, two, or three—in a circular sequence of bit pairs, 00, 01, 10, 11, then the sequence of 2D points produced by the 4D constellation mapping procedure will be rotated by 90, 180, and 270 degrees clockwise, respectively. Therefore, a differential encoder 30 of the form $I3_n'I2_n'=(I3_{n-2}'I2_{n-2}'+I3_nI2_n) \bmod 100_{base\ 2}$ and a corresponding differential decoder (68 in FIG. 4) of the form $I3_nI2_n=(I3_n'I2_n'-I3_{n-2}'I2_{n-2}') \bmod 100_{base\ 2}$ at the output of the convolutional decoder in the receiver will remove all 90-degree phase ambiguities in the constellation. (Note that the differential encoder 30 of FIG. 7 is intended to be the portion of the differential encoder 30 shown in FIG. 2 that differentially encodes certain bits.)

At the receiver, the decoder uses a conventional maximum-likelihood decoding algorithm such as the Viterbi decoding algorithm described in the Forney Viterbi algorithm article.

Referring to FIG. 10, as a preliminary step, the decoder must determine the 4D point in each of the eight 4D subsets which is closest to the received point and must calculate the squared distance from each closest 4D point to the received point. This squared distance is called the 4D branch metric for each trellis branch to which that subset is assigned. Because there are 4096 4D points in each of the eight 4D subsets, finding the nearest 4D points to the received point would be impractical without the following simplification.

For each of the two received 2D points corresponding to a received 4D point, the decoder determines the 2D point in each of the four 2D subsets which is closest to the received 2D point (100) and calculates the squared distance between each of those closest 2D points and the received 2D point (102). These squared distances are called 2D branch metrics. Because there are only 48 2D points in each of the four 2D subsets, the searching process is no more complex than the searching required with respect to a 2D code.

Next, the decoder determines the 4D point in each of the 16 4D types which is closest to the received 4D point and calculates the squared distance between each of those closest 4D points and the received 4D point. This is done merely by adding the two 2D branch metrics for the pair of 2D subsets corresponding to each 4D type, because the closest 4D point in each 4D type corresponds to the pair of closest 2D points for the pair of 2D subsets corresponding to that 4D type (104). Finally, the decoder compares the two sums of 2D branch metrics corresponding to the pair of 4D types within each 4D subset. The smaller sum becomes the 4D branch metric associated with that 4D subset, and the pair of 2D points associated with the smaller sum corresponds to the 4D point in that 4D subset which is closest to the received point (106).

The 4D branch metrics are then used to extend the trellis paths and generate final delayed decisions in the usual way (112).

Note that the closest 4D point in a 4D subset obtained from the above procedure may not be a valid 4D point because both of the corresponding 2D points may come from the outer group. This condition is detected in the block decoder 66 after final decisions on multi-dimensional signal points are made, by examining the pairs of bits, $Z2_nZ3_n$ and $Z2_{n+1}Z3_{n+1}$, associated with the pair of 2D points. If both are 10, then the corresponding 4D point is not valid. When this happens, one of the bit pairs is changed to make the two pairs together valid.

Because of the simplification in the 4D constellation mapping, the mapping from each finally decided 4D point back to the 14 information bits in the decoder is simplified. Otherwise, a straightforward mapping from the 4D constellation back to the 14 information bits would require a table of $32768\times14(=2^{15}\times14)$ bits. Even when all of the symmetries of the constellation are exploited, a table of size $2048\times11(=2^{11}\times11)$ bits would still be required. However, in the invention each 2D point of the pair of 2D points corresponding to the 4D point can first be mapped back to eight Z bits using a single bit mapping table 64 (FIG. 4). Then performing the inverse conversions corresponding to the bit converter and 4D block encoder produces the 14 information bits. The mapping from a 2D point back to eight Z bits requires a table of only $1536(=192\times8)$ bits even when the symmetries of the constellation are not exploited at all.

Another reduction in complexity of the decoder comes from the pairing of two 4D types into a 4D subset which reduces from eight to four the number of possible transitions leading to each state.

This coding system offers a number of benefits. The coding gain of the code over the uncoded case in terms of the minimum distance is 4.66 dB. The multiplicity of the error event with the minimum distance (the number of nearest neighbors) is 12. The peak-to-average power ratio is 2.16. The constituent 2D constellation has 192 points. The code is transparent to 90-, 180-, and 270-degree phase ambiguities. By comparison, for the best known 8-state, 2D code, the coding gain is 4.01 dB in terms of the minimum distance, the multiplicity of the error event with the minimum distance is 16, the peak-to-average power ratio is 1.93, and the 2D constellation has 256 points. Theoretically, both larger coding gain and smaller multiplicity of the error event with the minimum distance of the 4D code imply better performance over the 2D code. Furthermore, the larger coding gain of the 4D code is not obtained at the cost of increasing the peak-to-average power ratio to an unacceptably large value. It is important to keep this ratio small because the transmission medium may distort the transmitted signal nonlinearly. The smaller 2D constellation for the 4D code than for the 2D code implies simpler receiver design and better performance when the received signal contains signal-dependent noise. Transparency of the 4D code to 90-degree phase ambiguities gives immunity to rapid carrier phase changes. When both the 4D and 2D codes are tested in the laboratory, the performance of the 4D code is indeed significantly better than the 2D code in the presence of many kinds of channel impairments, and the 4D code is less complicated.

64-State, 8D Code

In another embodiment, the transmitter takes the 28 information bits which appear in four successive signaling intervals and encodes them into four 2D signal points drawn from a 2D constellation having only 160 points.

FIG. 11 shows how the 2D constellation is constructed and partitioned. The 2D constellation includes inner and outer groups of points defined by a boundary 120, as in the 16-state, 4D code. The inner group is still the 128-point cross constellation. However, the outer group has 32 points, only a quarter as many points as are in the inner group. The outer group points are again selected from possible points lying on the rectangular grid extended from the inner 128-point cross constellation, and are arranged as close to the origin as possible. Furthermore, if an outer group point is rotated by 90, 180, or 270 degrees about the origin, another outer group point is obtained. As in the 16-state, 4D code, the 160-point 2D constellation is partitioned into four equal-sized subsets, denoted A, B, C, and D; the 2D subsets are grouped into two 2D families, denoted AUB and CUD; all 2D subsets have the same numbers of inner and outer group points; and the ratio of the number of outer group points to the number of inner group points of each 2D subset is thus the same as that of the 2D constellation. The distance properties of points in those 2D subsets are the same as those for the 16-state, 4D code. In the constellation of FIG. 11, each 2D point is labeled with a six-bit value which represents the bits $Z2_{n+i}Z3_{n+i}Z4_{n+i}Z5_{n+i}Z6_{n+i}Z7_{n+i}$, i=0, 1, 2, or 3. The same pattern is assigned to each of the four 2D points which can be obtained from each other by 90° rotations.

Four identical such 2D constellations taken together can be conceived as a single 8D constellation having $655,360,000(=160^4)$ 8D points, the eight coordinates of each 8D point being the same as the four pairs of coordinates of the corresponding four 2D points, one from each 2D constellation. Only $536,870,912(=2^{29})$ of the 655,360,000 8D points will be used, namely the ones whose corresponding four 2D points include at most one 2D point belonging to the outer group. From now on, in discussing the 64-state code for transmitting 7 bits per signaling interval, we will refer to this 536,870,912-point 8D constellation as the 8D constellation. The average energy per signaling interval of the 8D constellation can be shown to be $23.59375d_0^2$. Since the peak energy per signaling interval is $50.5d_0^2$, the peak-to-average power ratio is 2.14, about the same as that of the 16-state, 4D code.

We now define $256(=4^4)$ 8D subtypes, each corresponding to a combination of four 2D subsets, and denoted as (A,A,A,A), (A,A,A,B), . . . , (B,C,C,B), (B,C,C,C), . . . , and (D,D,D,D). Each 8D subtype has 2,097,152 points and the minimum squared distance between two 8D points belonging to the same 8D subtype is $4d_0^2$, the same as the minimum squared distance between two 2D points belonging to the same 2D subset. (The squared distance between two 8D points is simply the sum of the four squared distances with respect to the four pairs of 2D points to which those two 8D points correspond.) Each 8D subtype, like the 8D constellation, contains only 8D points for which at most one of the four corresponding 2D points belongs to the outer groups of the four 2D subsets to which that 8D subtype corresponds.

Referring to FIG. 12A, the 256 8D subtypes are grouped into sixteen 8D subsets (col. 122). The grouping, while producing only one sixteenth as many 8D subsets as 8D subtypes, maintains the same minimum squared distance between two 8D points within each 8D subset as exists between two 8D points within each 8D subtype.

To form the 8D subsets, the first and second constituent 2D constellations corresponding to the 8D constellation are concatenated to form a first constituent 4D constellation. This 4D constellation is partitioned into eight 4D subsets, denoted as 0, 1, 2, . . . , and 7, and grouped into two 4D families, denoted 0U1U2U3 and 4U5U6U7, as in the 16-state, 4D code. A second constituent 4D constellation, formed by a concatenation of the third and fourth 2D constellations corresponding to the 8D constellation, is similarly partitioned. The distance properties of points in the 4D subsets are the same as those for the 16-state, 4D code.

Next, we define $64(=8\times8)$ 8D types, each corresponding to a pair of 4D subsets, and denoted as (0,0), (0,1), . . . , and (7,7). Each 8D type includes four 8D subtypes (because each 4D subset includes two 4D types, note that the 4D types are equivalent to 4D subtypes). The minimum squared distance between two 8D points belonging to the same 8D type is $4d_0^2$, the same as between two 4D points belonging to the same 4D subset, and as between two 8D points belonging to the same 8D subtype, as desired.

Those 64 8D types are grouped, four at a time, to form sixteen 8D subsets, denoted as 0, 1, 2, . . . , and 15, and the sixteen 8D subsets are grouped into two 8D families, denoted as 0U1U2U3U4U5U6U7 and 8U9U1-0U11U12U13U14U15. The distance properties of those 16 8D subsets are described below.

First, the four first 4D subsets associated with the four 8D types in each 8D subset span either the first 4D family 0U1U2U3 or the second 4D family 4U5U6U7, and likewise for the four second 4D subsets associated with that 8D subset. Thus, because the minimum squared distance between two 4D points belonging to different 4D subsets within the same 4D family is $2d_0^2$, the minimum squared distance between two 8D points belonging to the same 8D subset is $4d_0^2$, the same as between two 8D points belonging to the same 8D subtype.

Second, the four first and four second 4D subsets associated with each 8D subset in the first 8D family 0U1U2U3U4U5U6U7 span the same 4D family 0U1U2U3 or 4U5U6U7, and in the second 8D family the four first and four second 4D subsets associated with each 8D subset span different 4D families. Because the minimum squared distance between two points belonging to different 4D subsets within the same 4D family is $2d_0^2$, and the minimum squared distance between two 4D points belonging to different 4D subsets of different 4D families is $d_0^2$, the minimum squared distance between two 8D points belonging to different 8D subsets within the same 8D family is $2d_0^2$, and the minimum squared distance between two 8D points belonging to different 8D subsets of different 8D families is $d_0^2$.

Note that 8D subset 0 for this particular partition is from a portion of the 8D lattice used in the non-convolutional block encoding scheme disclosed in the Forney patent application, and the other 8D subsets can be viewed as portions of translations of that lattice.

There are other ways to partition the 8D constellation into sixteen 8D subsets to give the same distance properties between subsets as the above partition. However, the above partition has the special property that if an 8D subset is rotated by 90, 180, or 270 degrees, the same 8D subset is obtained. With this property, the design of a 90-degree rotationally invariant convolutional code using those sixteen 8D subsets does not need to take any 90-degree rotations of the constellation into account, and is thus made easier. Furthermore, a linear convolutional code is sufficient to remove all phase ambiguities of the 8D constellation.

Grouping the 256 8D subtypes into 16 8D subsets makes possible and makes easier the design of a simple and powerful convolutional code, and the decoder complexity is reduced as explained later.

The design of the 64-state, 90-degree rotationally invariant linear convolutional code with those sixteen 8D subsets is illustrated in FIGS. 12A and 13. A rate $\frac{3}{4}$, 64-state linear convolutional encoder 130 is used to generate the four selection bits needed to specify the 8D subset from which an 8D point is to be drawn. Encoder 130 includes 4T delay elements 132 and logical exclusive or elements 134 connected as shown. The current state of the encoder is $W1_n W2_n W3_n W4_n W5_n W6_n$. And the next state of the encoder is $W1_{n+4} W2_{n+4} W3_{n+4} W4_{n+4} W5_{n+4} W6_{n+4}$. Only certain sequences of state transitions are allowed as represented by the filled entries in the chart of FIGS. 14A and 14B, which corresponds to the information on a trellis diagram.

In FIGS. 14A and 14B, column 139 contains the decimal number of the current state. The remaining columns of the chart are each headed by the decimal number of one of the next states. A number entry in the chart represents a permissible transition between the current state and the next state indicated by the row and column in which the entry appears. The number entry itself identifies the 8D subset assigned to that transition. For example, a transition is permitted from current state 41 to next state 14 and 8D subset 15 is assigned to that transition. Each current state can be followed by only eight possible transitions, and can result from only eight possible transitions. The assignment of 8D subsets to transitions satisfies the following rules:

(1) The 8D subsets assigned to the transitions leading from a state are all from the same 8D family, and likewise for the 8D subsets associated with the transitions leading to a state.

(2) The minimum squared distance between two valid sequences of 8D points corresponding to two distinct trellis paths is larger than the minimum squared distance between two 8D points within each 8D subset. For example, referring to FIGS. 14A and 14B, this rule is satisfied by the following approach, among others. (a) For each current state $W1_n W2_n W3_n W4_n W5_n W6_n$, the eight possible next states are $W4_n W5_n W6_n X1X2X3$ for $X1X2X3 = 000, 001, 010, 011, 100, 101, 110,$ and $111$. (b) All the transitions originating from even-numbered states (states with $W6_n$ equal to 0) are assigned 8D subsets from the first 8D family 0U1U2U3U4U5U6U7. (c) All the transitions originating from odd-numbered states (states with $W6_n$ equal to 1) are assigned 8D subsets from the second 8D family 8U9U10U11U12U13U14U15. Then the second rule is satisfied as follows: (i) If Y is the 8D subset assigned to the transition from current state $W1_n W2_n W3_n W4_n W5_n W6_n$ to an even-numbered (or odd-numbered) next state, then Y is also the 8D subset assigned to the transition from current state $W1_n X1W3_n \overline{W4_n} X2W6_n$, for $X1X2 = 00, 01, 10,$ and $11$, to an odd-numbered (or even-numbered) next state. (ii) If Y is the 8D subset assigned to the transition from current state $W1_n W2_n W3_n W4_n W5_n W6_n$ to next state $W4_n W5_n W6_n X1X2X3$, then Y is also the 8D subset assigned to the transition from current state $W1_n W2_n W3_n W4_n \overline{W5_n} W6_n$ to next state $W4_n \overline{W5_n} W6_n X1\overline{X2}X3$. (iii) If Y is the 8D subset assigned to the transition from current state $W1_n W2_n W3_n W4_n W5_n W6_n$ to next state $W4_n W5_n W6_n X1X2X3$, then Y is also the 8D subset assigned to the transition from current state $W1_n \overline{W2_n} W3_n W4_n \overline{W5_n} W6_n$ to next state $W4_n \overline{W5_n} W6_n \overline{X1} X4X3$, for $X4=0$ or $1$.

The first rule guarantees that the minimum squared distance between any two allowed sequences of 8D points is $4d_0^2$. And the coding gain (in terms of the minimum distance) of the code over the uncoded 128-point 2D cross constellation therefore is $$10 \log_{10} \frac{\frac{4d_0^2}{23.59375 d_0^2}}{\frac{d_0^2}{20.5 d_0^2}} = 5.41 \text{ dB}$$

The second rule eliminates minimum distance error events in more than one 8D point which differ from a given sequence of 8D points, thus reducing the multiplicity of the minimum distance error events to 240 per 8D point (or equivalently, 60 per 2D point), which is, in this case, also the number of 8D points at squared distance $4d_0^2$ from a given 8D point in the same 8D subset.

There is no need to consider 90° rotations of the constellation in the design of a 90° rotationally invariant convolutional code because the same 8D subset is obtained when an 8D subset is rotated by 90°, 180°, or 270°.

We now describe how to map the four output bits of the convolutional encoder and the 25 remaining uncoded information bits into the 8D constellation. Eight coordinate values are needed to define each 8D point; therefore, a straightforward mapping would require a table of $4,294,967,296 (=2^{29} \times 8)$ coordinate values. Even when all the symmetries of the 8D constellation are exploited to reduce the number of coordinate values, a table of 16,777,216(=$2^{21}\times 8$) coordinate values would still be required. However, the invention allows this table to be reduced to only 320 (=160×2 coordinate values), and further reduced to 80 (=40×2) when all the symmetries of the constellation are exploited, permitting a substantial saving of hardware capacity.

Referring again to FIGS. 12A&B and 13, after using the four output bits of the convolutional encoder to specify an 8D subset, another four non-convolutionally-coded information bits are used to specify an 8D subtype within the 8D subset.

To make the code transparent to 90-degree phase ambiguities in specifying the 8D subtype, the following requirements are met. First, the same pattern of the first two uncoded information bits, $I4_n$ and $I5_n$, are associated with each of the four 8D subtypes which can be obtained from each other by 90-degree rotations. Second, the association of the second two uncoded information bits, $I6_n'$ and $I7_n'$, with 8D subtypes is as follows. For each set of four 8D subtypes which can be obtained from each other through 90-degree rotations, arrange the four associated values of the bit pair $I6_n'I7_n'$ into a four-element sequence such that the 8D subtypes corresponding to the second, third, and fourth values of this sequence can be obtained by rotating the 8D subtype corresponding to the first value of the sequence by 90, 180, and 270 degrees clockwise, respectively. Then, all of these four-element sequences are rotated versions of the same four-element circular sequence of bit pairs. In this code, the four element circular sequence is 00, 01, 10, 11. And, for example, a rotated version of the four-element circular sequence is the sequence 01, 10, 11, 00.

A bit converter 140 then converts the four output bits of the convolutional encoder and the four uncoded information bits into four pairs of selection bits, $Z0_mZ1_m$, m=n, n+1, n+2, n+3, to select the four 2D subsets corresponding to the 8D subtype. The correspondence between selection bits $Z0_mZ1_m$ and 2D subsets is the same as that for 16-state, 4D code. The bit conversion table can be derived from the procedure shown in FIG. 12B which satisfies the two requirements described above for mapping the four uncoded bits to an 8D subtype within an 8D subset.

The 21 uncoded information bits which remain will be used to select an 8D point from the previously selected 8D subtype. Referring to FIGS. 11, 13, and 15, an 8D block encoder 142 takes nine of the remaining uncoded information bits and generates four groups of three selection bits each, $Z2_mZ3_mZ4_m$, m=n, n+1, n+2, n+3. Each group can assume any of the values 000, 001, 010, 011, and 100, but at most one of the four groups can assume the value 100. The first group $Z2_nZ3_nZ4_n$ will be used to select the inner group or outer group of the first 2D subset corresponding to the previously selected 8D subtype, and likewise for the three other groups with respect to the second, third, and fourth 2D subsets. The inner group is organized into four quarters. If the group of three selection bits is 000, 001, 010, or 011, one of the quarters of the inner group is selected; otherwise, the outer group is selected.

There are eight 2D points in the outer group or in each of the four quarters of the inner group of a 2D subset, and twelve encoded information bits remain for selecting from among those 2D points. Those twelve bits are taken in four groups of three bits each, and are renamed as $Z5_mZ6_mZ7_m$, m=n, n+1, n+2, n+3. The first group $Z5_nZ6_nZ7_n$ will be used to select a 2D point from the previously selected outer group or from the selected quarter of the inner group of the first 2D subset, and likewise for the other three groups $Z5_mZ6_mZ7_m$, m=n+1, n+2, n+3.

To summarize, the bit converter and 8D block encoder take the four output bits of the convolutional encoder and the 25 remaining uncoded information bits and produce 32 point selection bits (R=8). Those 32 selection bits are then grouped into four groups of eight selection bits each, $Z2_mZ3_mZ4_mZ5_mZ6_mZ7_mZ0_mZ1_m$, m=n, n+1, n+2, n+3. The first group $Z2_nZ3_nZ4_nZ5_nZ6_nZ7_nZ0_nZ1_n$ is used to address a 2D mapping table, the table being constructed from the constellation of FIG. 11 simply by associating with the coordinates of each point the eight bits needed to represent the point (namely the six bits marked under the point and the two bits $Z0_nZ1_n$ needed to specify the 2D subset), to obtain the pair of coordinates for the first 2D point corresponding to the 8D point defined by the four output bits of the convolutional encoder and the 25 remaining uncoded information bits. Likewise, the second, third, and fourth groups of selection bits address the same table to obtain the coordinates of the second, third, and fourth 2D points, respectively. Since each group of eight selection bits can assume only 160 values (because $Z2_mZ3_mZ4_m$ cannot assume any of the values 101, 110, and 111), the table has only 320 (=160×2) coordinate values. The table can be further reduced to only 80 (=40×2) coordinate values since the same pattern of $Z2_mZ3_mZ4_mZ5_mZ6_mZ7_m$ is associated with each of the four 2D points which can be obtained from each other by 90-degree rotations. In that case, the table provides the pair of coordinate values corresponding to $Z2_mZ3_mZ4_mZ5_mZ6_mZ7_m$ for a specific pattern of $Z0_mZ1_m$. The pair of coordinate values corresponding to other patterns of $Z0_mZ1_m$ can be obtained through 90-degree rotations of the pair of coordinates obtained for the specific pattern of $Z0_mZ1_m$.

The last technique also enables making the code transparent to 90-degree rotations of the constellation, as described later.

A straightforward implementation of the bit converter 140 requires a table of 256×8 (=$2^8\times 8$) bits. And a straightforward implementation of the 8D block encoder 142 requires a table of 512×12 (=$2^9\times 12$) bits. Even though the sizes of these tables are already insignificant compared to those which would be required by an 8D constellation mapping which did not use the bit converter and the 8D block encoder, they can be further reduced.

Referring to FIG. 15, the 8D block encoder 142 can be implemented as a short program without using any table. Referring to step 1 of FIG. 12B, the size of the bit converter table can be reduced to 16×8 (=$2^4\times 8$) bits by including in the table only the four pairs of selection bits, $Z0_mZ1_m$, m=n, n+1, n+2, n+3, corresponding to the four output bits of the convolutional encoder for a specific pattern of the four uncoded information bits $I4_nI5_nI6_n'I7_n'$ e.g., 0000 appearing at the input of the bit converter (FIG. 13). The four pairs of selection bits corresponding to other patterns of $I4_nI5_nI6_n'I7_n'$ can be obtained through modifications of the four pairs of selection bits for the specific pattern of $I4_nI5_nI6_n'I7_n'$. The modifications are based on how $I4_nI5_nI6_n'I7_n'$ is mapped into an 8D subtype (FIG. 12B).

Referring to FIG. 13, if we translate a sequence of the bit pairs $I6_n'I7_n'$ appearing at the input of the bit converter all by the same number of positions—one, two, or three—in the same circular sequence of bit pairs, 00, 01, 10, 11, defined above with respect to the mapping of bit pairs $I6_n'I7_n'$ into 8D subtypes, then the resulting sequence of 2D points produced by the 8D constellation mapping will be rotated by 90, 180, and 270 degrees clockwise, respectively. Therefore, a differential encoder 144 of the form $I6_n'I7_n' = (I6_{n-4}'I7_{n-4}' + I6_nI7_n)$ mod $100_{base\ 2}$ in the transmitter (FIG. 13) and a corresponding differential decoder of the form $I6_nI7_n = (I6_{n-}'I7_n' - I6_{n-4}'I7_{n-4}')$ mod $100_{base\ 2}$ at the output of the convolutional decoder in the receiver will remove all 90-degree phase ambiguities in the constellation.

At the receiver, the decoder again uses a conventional maximum-likelihood decoding algorithm such as the Viterbi decoding algorithm.

Referring to FIG. 16, as a preliminary step, the decoder must determine the 8D point in each of the 16 8D subsets which is closest to the received point and must calculate the squared distance from each closest 8D point to the received point. This squared distance is called the 8D branch metric for each trellis branch to which that subset is assigned. Because there are 33,554,432 8D points in each of the 16 8D subsets, finding the nearest 8D points to the received point would be impractical without the following simplification. For each of the four received 2D points corresponding to a received 8D point, the decoder determines the 2D point in each of the four 2D subsets which is closest to the received 2D point (145) and calculates the squared distance between each of those closest 2D points and the received 2D point (146). These squared distances are called 2D branch metrics. Because there are only 40 2D points in each of the four 2D subsets, the searching process is easy, being no more complex than the searching required with respect to a 2D code.

Next, the decoder determines (147) the 4D point in each of the eight 4D subsets which is closest to the first received 4D point, the first received 4D point being the 4D point corresponding to the first and second 2D points of the received 8D point, and calculates the squared distance (called the 4D branch metric) between each of those closest 4D points and the first received 4D point, in the same manner as for the 16-state, 4D code. Only two additions and one comparison are required for each 4D subset. The same procedure is repeated for the second received 4D point which is the point corresponding to the third and fourth 2D points of the received 8D point.

The decoder then determines the 8D point in each of the 64 8D types which is closest to the received 8D point and calculates the squared distance between each of those closest 8D points and the received 8D point. This is done by adding (149) the two 4D branch metrics for the pair of 4D subsets corresponding to each 8D type, because the closest 8D point in each 8D type corresponds to the pair of closest 4D points for the pair of 4D subsets corresponding to that 8D type. Finally, the decoder compares (151) the four sums of 4D branch metrics corresponding to the four 8D types within each 8D subset. The smallest sum becomes the 8D branch metric associated with that 8D subset, and the pair of 4D points associated with the smallest sum correspond to the 8D point in that 8D subset which is closest to the received point. The 8D branch metrics are then used (153) to extend the trellis paths and generate final delayed decisions in the usual way.

However, the closest 8D point in a particular 8D subset obtained from the above procedure may not be a valid point because more than one of the four corresponding 2D points may come from the outer group. This condition is detected in the block decoder 66 by examining the four groups of bits, $Z2_mZ3_mZ4_m$, $m=n$, $n+1$, $n+2$, $n+3$, associated with the four corresponding 2D points. If more than one of the groups is 100, the corresponding 8D point is not valid. Then a modification is made on those four groups to render them together valid.

Because of the simplification in the 8D constellation mapping, at the receiver the mapping from each finally decided 8D point back to the 28 information bits in the decoder is also simplified. Otherwise, a straightforward mapping from the 8D constellation back to the 28 information bits would require a bit mapping table of $536,870,912 \times 28$ ($=2^{29} \times 28$) bits. Even when all of the symmetries of the constellation are exploited, a table of size $2,097,152 \times 21$ ($=2^{21} \times 21$) bits would still be required. However, in the invention, each 2D point of the four 2D points corresponding to the 8D point can first be mapped back to eight Z bits. Then performing the inverse conversions corresponding to the bit converter and 8D block encoder produces the 28 information bits. The mapping from a 2D point back to eight Z bits requires a table of only $160 \times 8$ bits even when the symmetries of the constellation are not exploited. The inverse conversion corresponding to the 8D block encoder can be done with a short program which does not even require a table, as was done for the 8D block encoder. The inverse conversion corresponding to the bit converter requires a table of only $256 \times 7$ bits, insignificant compared to the size of the table which would otherwise be required to map from the 8D constellation back to the 28 information bits.

Another reduction in decoder complexity comes from grouping 16 8D subtypes into an 8D subset, thus reducing from 128 to eight the number of transitions leading to each state, which saves substantial processing time, software, and hardware capacities.

The coding gain of this code over the uncoded case in terms of the minimum distance is 5.41 dB. The multiplicity of the error event with the minimum distance is 60. The peak-to-average power ratio is 2.14. The code is transparent to 90°, 180°, and 270° phase ambiguities. The constituent 2D constellation has 160 points. As a comparison, the coding gain of the best known 32-state, 2D code is 4.80 dB in terms of the minimum distance. The multiplicity of the error event with the minimum distance is 16. The peak-to-average power ratio is 1.93. The 2D constellation has 256 points. Theoretically, although the 8D code has a larger multiplicity of the error event with the minimum distance, the effect of this larger multiplicity is more than compensated by the larger coding gain in terms of the minimum distance of the 8D code. As for the 4D codes, the larger coding gain of the 8D code is not obtained by increasing the peak-to-average power ratio to an unacceptably large value. The 8D code has a 2D constellation which is even smaller than for the 4D code, implying further improvement in the performance of the 8D code over the 4D and 2D codes. Transparency of the 8D code to 90-degree phase ambiguities gives immunity to rapid carrier phase changes. When implemented in the laboratory, the 8D code is found to have significantly better performance than the 2D code—in some cases, more than 1.0 dB better performance in the presence of many kinds of channel impairments. The 64-state, 8D code is less complicated than the 32-state, 2D code, and is less than twice as complicated as the 8-state, 2D code. The 64-state, 8D code therefore represents an advance from 2D codes because it improves the performance of 2D codes without increasing the complexity.

Embodiments with Fewer States

The number of states of the 16-state, 4D or 64-state, 8D codes can be reduced without sacrificing the coding gain in the minimum distance, but the multiplicity of the error event with the minimum distance would be increased.

For example, a 32-state, 8D code can provide 5.41 dB coding gain in the minimum distance over the uncoded case, the same as for the 64-state, 8D code, but its multiplicity of the error event with the minimum distance is 124, larger than 60 for the 64-state, 8D code. It can be shown that the minimum number of states required for an 8D convolutional code to provide 5.41 dB coding gain in the minimum distance over the uncoded case is 16. And the minimum number of states required for a 4D convolutional code to provide 4.66 dB coding gain is 8.

These codes with fewer states are useful when the complexity needed to achieve the larger coding gain in the minimum distance of the 16-state, 4D or 64-state, 8D code is an issue.

The design of the 4D or 8D convolutional codes with fewer states is similar to that for the 16-state, 4D or 64-state, 8D code except that with fewer states the minimum squared distance between two valid sequences of 4D (or 8D) points corresponding to two distinct trellis paths can no longer be required to be larger than the minimum squared distance between two 4D (or 8D) points within each 4D (or 8D) subset. As a result the multiplicities of the error events with the minimum distance of those codes with fewer states are larger than for the 16-state, 4D or 64-state, 8D code.

Embodiments with Finer Partitioning of the 4D or 8D Constellation Using the Same Partitioning of the Constituent 2D Constellation Given the partitioning of the 4D or 8D constellation for the 16-state, 4D or 64-state, 8D code, it is impossible to further increase the coding gain in the minimum distance or reduce the multiplicity of the error event with the minimum distance by designing a more complicated convolutional code, for example by increasing the number of states.

With a finer partitioning of the 4D or 8D constellation, however, it is possible to further reduce the multiplicity of the error event with the minimum distance by designing a convolutional code with more states.

For example, a 32-state, 4D code with 16 4D subsets, each subset consisting of only one 4D type as defined for the 16-state, 4D code, can provide 4.66 dB coding gain in the minimum distance over the encoded case, the same as for the 16-state, 4D code, but the multiplicity of the error event with the minimum distance is only 4, less than the 12 for the 16-state, 4D code and the same as that for the uncoded system.

These codes with smaller multiplicity of the error event with the minimum distance are useful when excess processing capacity is available for the 16-state, 4D or 64-state, 8D code, but not enough excess to implement 4D or 8D convolutional codes with a constituent 2D constellation partitioned into more than four 2D subsets (of the kind discussed below).

Embodiments with Finer Partitioning of 4D or 8D Constellation Using Finer Partitioning of the Constituent 2D Constellation To further increase the coding gain in the minimum distance of the 4D or 8D codes from that of the 16-state, 4D or 64-state, 8D codes while maintaining a simple 4D or 8D constellation mapping, a finer partitioning of the constituent 2D constellation can be used.

As an example, a 64-state, 4D code with the constituent 2D constellation partitioned into eight 2D subsets can provide 5.63 dB coding gain in the minimum distance over the uncoded case, which is 0.97 dB more than that of the 16- or 32-state, 4D code.

Referring to FIG. 17, in such a 64-state, 4D code for sending 7 information bits per signaling interval, the 2D constellation includes inner and outer groups of points, as for the 16-state, 4D code. The inner group remains as the 128-point cross constellation. Note that the constellation has been rotated 45° compared with the 16-state, 4D code constellation. The outer group has 64 points, which is again half as many as the inner group points. The outer group points are again selected from the grid extended from the inner 128-point cross constellation and arranged as close to the origin as possible, but with the following two constraints satisfied. The first constraint is that if an outer point is rotated by 90, 180, or 270 degrees, another outer point is obtained. The second constraint is that when the 2D constellation is partitioned into eight subsets, described below, each subset has the same number of outer points as other subsets. The inner 128-point cross constellation also satisfies those two constraints.

The 192-point 2D constellation is partitioned into eight equal-sized subsets, denoted as A, B, . . . , and H. The ratio of the number of outer group points to the number of inner group points of each 2D subset is the same as for the 2D constellation as a whole. The subsets are grouped into four 2D subfamilies, denoted as AUB, CUD, EUF, and GUH, and the subfamilies are further grouped into two 2D families, denoted as AUBUCUD and EUGUFUH. The minimum squared distance, $8d_0^2$, between points belonging to the same subset is greater than the minimum squared distance, $4d_0^2$, between points belonging to the same subfamily, which is in turn greater than the minimum squared distance, $2d_0^2$, between points belonging to the same family, which is yet in turn greater than the minimum squared distance, $d_0^2$, between any two points.

In the constellation of FIG. 17, the same five-bit pattern is assigned to each of the four 2D points which can be obtained from each other by 90° rotations.

Two identical such 2D constellations taken together can be conceived as a single 4D constellation having 36864 (=192×192) 4D points. Only 32768 (=$2^{15}$) 4D points of the 36864 points will be used, namely the ones whose corresponding pair of 2D points do not both belong to the outer group. From now on in discussing the 64-state code for transmitting 7 information bits per signaling interval, we will refer to this 32768-point 4D constellation as the 4D constellation, which again happens to be identical to that for the 16-state, 4D code except for a 45° rotation. The average energy per signaling interval for this 4D constellation can be shown to be $28.0625d_0^2$. Since the peak energy per signaling interval is $60.5d_0^2$, the peak-to-average power ratio is 2.16.

We now define 64 (=8×8) 4D types, each corresponding to a pair of 2D subsets, and denoted as (A,A), (A,B), ..., and (H,H). Each 4D type has 512 points and the minimum squared distance between two 4D points belonging to the same 4D type is $8d_0^2$, which is the same as the minimum squared distance between two 2D points belonging to the same 2D subset. Note also that each 4D type has the same structure as the 4D constellation. That is, a 4D point belongs to a 4D type only if the pair of 2D points corresponding to that 4D point do not both belong to the outer groups of the pair of 2D subsets to which that 4D type corresponds.

Referring to FIG. 18, the 4D types are paired to form 32 4D subsets (col. 150), denoted as 0, 1, ..., and 31. The pairing, while producing only half as many 4D subsets as 4D types, maintains the same minimum squared distance between two 4D points within each 4D subset as exists between two 4D points within each 4D type.

The 32 4D subsets are grouped into eight 4D subfamilies, denoted as 0U1U8U9, 2U3U10U11, 4U5U12U13, 6U7U14U15, 16U17U24U25, 18U19U26U27, 20U21U2-8U29, and 22U23U30U31, and are further grouped into two 4D families, denoted as $$\bigcup_{i=0}^{15} i \text{ and } \bigcup_{i=16}^{31} i.$$

Note that the minimum squared distance, $8d_0^2$, between 4D points belonging to the same 4D subset is greater than the minimum squared distance, $4d_0^2$, between 4D points belonging to the same 4D subfamily, which is in turn greater than the minimum squared distance, $2d_0^2$, between 4D points belonging to the same 4D family, which is yet in turn greater than the minimum squared distance, $d_0^2$, between any two 4D points. Note also that if a 4D subset is rotated by 90, 180, or 270 degrees, another 4D subset is obtained.

Referring to FIG. 19, a rate 4/5, 64-state convolutional encoder can then be used to generate the five selection bits needed to specify the 4D subset from which a 4D point is to be drawn. The assignment of 4D subsets to state transitions should satisfy at least the following two rules. First the 4D subsets assigned to the transitions leading from a state are all from the same 4D family, and likewise for the 4D subsets assigned to the transitions leading to a state. There are 16 transitions leading from each state to 16 different next states. Those 16 next states can be grouped into four groups of four states each such that the same subsequent 16 states follow each of the four next states in a group. The second rule then says that the 4D subsets assigned to either (a) the transitions from a given state to the four next states in a given group or (b) the transitions to a given next state from the four states in a given group are from the same 4D subfamily.

Following at least these two rules, it can be shown that a 64-state, 4D code can be designed such that the minimum squared distance between any two valid sequences of 4D points is $5d_0^2$. The coding gain of this code in the minimum distance over the uncoded case is thus $$10 \log_{10} \frac{\dfrac{5d_0^2}{28.0625d_0^2}}{\dfrac{d_0^2}{20.5d_0^2}} = 5.63 \text{ dB}$$

Satisfaction of the first rule guarantees that the minimum squared distance between any two allowed sequences of 4D points is at least $4d_0^2$. Satisfaction of the second rule above is necessary in order for the minimum squared distance between any two sequences of 4D points to be greater than $4d_0^2$.

The multiplicity of the error event with the minimum distance of the 64-state, 4D code is 72 and the code is transparent to all 90-degree phase ambiguities.

To further increase the coding gain in the minimum distance or reduce the multiplicity of the error event with the minimum distance of the convolutional code using those 32 4D subsets, the number of states can be increased. The limit on the coding gain in the minimum distance in this case is 7.66 dB and the limit on the multiplicity of the error event with the minimum distance is 12. Further improvements can be attained using even finer partition of the 4D constellation.

Referring to FIGS. 18 and 19, in mapping the available bits into the 4D constellation, after using the five output bits of the convolutional encoder 151 to specify a 4D subset, a sixth uncoded information bit is used to specify a 4D type within the 4D subset. A bit converter 152 then converts those six bits into two groups of three selection bits each, $Z0_n Z1_n Z2_n$ and $Z0_{n+1} Z1_{n+1} Z2_{n+1}$, which are used to select the pair of 2D subsets corresponding to the 4D type. In the constellation of FIG. 17, each three selection bits correspond to a 2D subset in accordance with the following table:

| 2D Subset | $Z0_n Z1_n Z2_n$ or $Z0_{n+1} Z1_{n+1} Z2_{n+1}$ |
|---|---|
| A | 000 |
| B | 010 |
| C | 001 |
| D | 011 |
| E | 110 |
| F | 101 |
| G | 111 |
| H | 100 |

The nine uncoded information bits which remain will be used to select a 4D point from the previously selected 4D type.

A 4D block encoder 154, which is identical to that for the 16-state, 4D code, takes three of the remaining uncoded information bits and generates two pair of selection bits, $Z3_n Z4_n$ and $Z3_{n+1} Z4_{n+1}$, whose properties and uses are like the pairs $Z2_n Z3_n$ and $Z2_{n+1} Z3_{n+1}$ described for the 16-state, 4D code block encoder.

There are eight 2D points in the outer group or in either half of the inner group of a 2D subset, and six uncoded information bits remain for selecting from among those 2D points. Those six bits are taken in two groups of three bits each, and are renamed as $Z5_n Z6_n Z7_n$ and $Z5_{n+1} Z6_{n+1} Z7_{n+1}$. The first group $Z5_n Z6_n Z7_n$ will be used to select a 2D point from the previously selected outer group or the selected half of the inner group of the first 2D subset, and likewise for the second group $Z5_{n+1} Z6_{n+1} Z7_{n+1}$.

To summarize, with this construction and partition of the 4D constellation, the bit converter, and the 4D block encoder, the 4D constellation mapping is achieved through two 2D constellation mappings. Both the encoder and decoder complexities are thus reduced.

Embodiments Using 16D Convolutional Codes

A 16D constellation can be constructed and partitioned as follows to send 7 information bits per signaling interval.

Referring to FIG. 20, the constituent 2D constellation includes inner and outer groups of points, the inner group being the 128-point cross constellation. The outer group has only 16 points, which is one eighth as many as the inner group points. The outer group points are selected from the rectangular grid extended from the inner 128-point cross constellation, and arranged as close to the origin as possible. Furthermore, if an outer point is rotated by 90, 180, or 270 degrees, another outer point is obtained. As in the case of 16-state, 4D and 64-state, 8D codes, the 144-point 2D constellation is partitioned into four equal-sized subsets, denoted as A, B, C, and D, and the subsets are grouped into two families, denoted as A∪B and C∪D. The distance properties of those subsets are the same as those for 16-state, 4D and 64-state, 8D codes. All subsets have the same numbers of inner and outer group points and the ratio of the number of outer group points to the number of inner group points of each 2D subset is the same as for the 2D constellation as a whole.

Eight identical such 2D constellations taken together can be conceived as a single 16D constellation having $144^8$ 16D points, the 16 coordinates of each 16D point being the same as the eight pairs of coordinates of the corresponding eight 2D point, one from each 2D constellation. Only $2^{57}$ of the $144^8$ 16D points are used, namely those for which at most one of the eight corresponding 2D points comes from the outer group. From now on, when we refer to the 16D constellation, we mean this $2^{57}$-point 16D constellation unless otherwise specified. It can be shown that the average energy per signaling interval of the 16D constellation is $21.875d_0^2$. Since the peak energy per signaling interval is $44.5d_0^2$, the peak-to-average power ratio is 2.03, which is even smaller than the peak-to-average power ratio, 2.07, of the non-channel coded 128-point cross 2D constellation. The squared distance between two 16D points is the sum of the eight squared distances with respect to the eight pairs of 2D points to which those two 16D points correspond.

We now define $4^8$ 16D subtypes, each corresponding to a combination of eight 2D subsets, and denoted as (A,A,A,A,A,A,A,A), (A,A,A,A,A,A,A,B), . . . , and (D,D,D,D,D,D,D,D). Each 16D subtype has $2^{41}$ points and the minimum squared distance between two 16D points belonging to the same 16D subtype is $4d_0^2$, the same as the minimum squared distance between two 2D points belonging to the same 2D subset. Each 16D subtype has the same structure as for the 16D constellation. That is, a 16D point belongs to a 16D subtype only if at most one of the eight 2D points corresponding to that 16D point belongs to the outer groups of the eight 2D subsets to which that 16D subtype corresponds. The 16D subtypes are grouped into 16D subsets in such a way as to minimize the number of 16D subsets while maintaining the minimum squared distance between two 16D points within each 16D subset to be the same as that within each 16D subtype. To accomplish this, first the first, second, third, and fourth 2D constellations are taken as forming a first 8D constellation. This 8D constellation is partitioned into 16 8D subsets, which are denoted as 0, 1, . . . , and 15, and are grouped into two 8D families, denoted as 0∪1∪2∪3∪4∪5∪6∪7 and 8∪9∪10∪11∪12∪13∪14∪15, as in the case of 64-state, 8D code. The second 8D constellation formed by the fifth, sixth, seventh, and eighth 2D constellations of the 8D constellation is likewise partitioned. The distance properties of those 8D subsets are the same as those for the 64-state, 8D code.

Next, we define 256 (=16×16) 16D types, each corresponding to a pair of 8D subsets, and denoted as 16D type (0,0), (0,1), . . . , (15,15). Note that each 16D type has 256 16D subtypes and the minimum squared distance between two 16D points belonging to the same 16D type is $4d_0^2$, which is the same as the minimum squared distance between two 8D points belonging to the same 8D subset, which is in turn the same as the minimum squared distance between two 16D points belonging to the same 16D subtype, as desired. This is the first step towards the grouping of 16D subtypes into 16D subsets.

Now, referring to FIGS. 21A, and 21B, those 256 16D types are grouped to form 32 16D subsets, denoted as 16D subset 0, 1, . . . , and 31, and further grouped into two 16D families, denoted as $$\bigcup_{i=0}^{15} i \text{ and } \bigcup_{i=16}^{31} i.$$

In this grouping, for each 16D subset, the eight first 8D subsets associated with the eight 16D types in that 16D subset span either the first 8D family 0∪1∪2∪3∪4∪5∪6∪7 or the second 8D family 8∪9∪10∪11∪12∪13∪14∪15, and likewise for the eight second 8D subsets associated with that 16D subset. Since the minimum squared distance between two 8D points belonging to different 8D subsets within the same 8D family is $2d_0^2$, the minimum squared distance between two 16D points belonging to the same 16D subset is $4d_0^2$, which is the same as the minimum squared distance between two 16D points belonging to the same 16D subtype.

For each 16D subset in the first 16D family $$\bigcup_{i=0}^{15} i,$$

the eight first and eight second 8D subsets associated with the eight 16D types of that 16D subset span the same 8D family 0∪1∪2∪3∪4∪5∪6∪7 or 8∪9∪10∪11∪12∪13∪14∪15. And for each 16D subset in the second 16D family $$\bigcup_{i=16}^{31} i,$$

the eight first and eight second 8D subsets associated with the eight 16D types of that 16D subset span different 8D families. Since the minimum squared distance between two 8D points belonging to different 8D subsets within the same 8D family is $2d_0^2$, and the minimum squared distance between two 8D points belonging to different 8D subsets of different 8D families is $d_0^2$, the minimum squared distance between two 16D points belonging to different 16D subsets within the same 16D family is $2d_0^2$, and the minimum squared distance between two 16D points belonging to different 16D subsets of different 16D families is $d_0^2$.

Since the same 8D subset is obtained when an 8D subset is rotated by 90, 180, or 270 degrees, this property is preserved in the 16D subsets because of the way in which those 16D subsets are obtained. Thus, the design of a 90-degree rotationally invariant convolutional code with those 32 16D subsets does not need to take any 90-degree rotations of the constellation into account. The design of 90-degree rotationally invariant convolutional code is thus made much easier. And a linear convolutional code is sufficient to remove all the 90-degree phase ambiguities of the constellation.

With those 32 16D subsets, it can be shown that a rate 4/5, 32-state convolutional code can be designed such that the minimum squared distance between any two valid sequences of 16D points is $4d_0^2$. The coding gain of this code in the minimum distance over the uncoded case is thus $$10 \log_{10} \frac{\frac{4d_0^2}{21.875d_0^2}}{\frac{d_0^2}{20.5d_0^2}} = 5.74 \text{ dB}$$

The design of this code only needs to satisfy the following requirement. The 16D subsets assigned to the transitions leading from a state are all from the same family of 16D subsets, and likewise for the 16D subsets assigned to the transitions leading to a state. The multiplicity of the error event with the minimum distance of this code is larger than 1000. This number can be reduced by using more states. The limit on the multiplicity of the error event with the minimum distance, which is limited to $4d_0^2$, of the convolutional code with those 32 16D subsets is 284. Further performance improvements can be obtained using a finer partition of the 16D constellation.

As in the case of 4D and 8D convolutional codes, the 16D constellation mapping can be achieved through eight 2D constellation mappings with the assistance of a bit converter and a 16D block encoder. Furthermore, in the decoder, the task of finding the point in each of the 32 16D subsets closest to the received point can be done by first finding the 8D point in each of the 16 8D subsets closest to the first received 8D point, the first received 8D point consisting of the first four 2D points of the received 16D point, and likewise for the second received 8D point which consists of the remaining four 2D points of the received 16D point. Thus the encoder and decoder are relatively simple. Those 16D convolutional codes are useful when larger coding gain in the minimum distance and smaller constituent 2D constellation are desirable.

Other Embodiments

Other embodiments are within the following claims.

The convolutional code can be of the feedforward type. In that case, the convolutional decoder (FIG. 4), in addition to providing the finally-decided multidimensional point, also needs to provide the associated m bits corresponding to the input of a rate m/m+1 convolutional encoder. In that case, performing the inverse conversions corresponding to the bit converter and multidimensional block encoder on the NR bits obtained by N uses of bit mapping table 64 provides only NQ-m differentially-encoded information bits. The remaining m differentially-encoded bits are the m bits provided directly from the convolutional decoder.

While maintaining the number of information bits to be transmitted in a block of N signaling intervals as an integer, the number Q need not be an integer. For example Q could be $6\frac{1}{8}$, $5\frac{1}{4}$, or $4\frac{3}{8}$. (In the case of $6\frac{1}{8}$ bits per interval using an 8D code, the number of bits per block being sent alternates between 24 and 25.) In this case, the partition of the multidimensional constellation, the design of the rotationally-invariant convolutional code, the differential encoder and decoder, the bit converter and deconverter for the constellation mapping, and the search for the closest point in each of the multidimensional subsets remain the same as before. A block encoder is used to generate S additional bits, when needed, such that the resultant NQ+S+1 bits to be mapped into the 2N-dimensional constellation can be evenly divided by N. Denote the resulting quotient as R. S is thus at most N−1. The block encoder is a combination of J block encoders (of the kind previously described) which are operated in parallel, and are denoted as $2N_j$-dimensional block encoders for j equal to 1,2, . . . , J. J may be equal to 1. Each $N_j$ is a power of 2 and is at most equal to N. Two $N_j$ for different j may or may not be equal. Note that each $2N_j$-dimensional block encoder adds $N_j-1$ additional bits. The selection of $N_j$ is such that the sum of $N_j$, for j equal to 1,2, . . . ,J, is at most equal to N, preferably as close to N as possible, and the sum of $N_j-1$, for j equal to 1,2, . . . J, is equal to S.

For each $2N_j$-dimensional block encoder, a $2N_j$-dimensional constellation is formed as before with the number of inner-group points in each of the $N_j$ constituent 2D signal constellations equal to $2^{R-1}$, and the number of outer-group points in that 2D constellation equal to $(1/N_j) \times 2^{R-1}$.

A 2N-dimensional constellation is then formed by concatenating those $2N_j$-dimensional constellations with $$N - \sum_{j=1}^{J} N_j$$

2D constellations, if there are any, each with $2^R$ points (not divided into two groups).

A 2N-dimensional constellation mapping and demapping are then performed accordingly by N uses of a table for the largest constituent 2D constellation involved.

N need not be a power of 2. Then the partition of the 2N-dimensional constellation can still be done in an iterative manner as before. When N is an even integer, the partition of the 2N-dimensional constellation is based on the partition of an N-dimensional constellation in the same manner as before. When N is an odd integer, the partition of the 2N-dimensional constellation is based on the partitions of $2N_1$- and $2N_2$-dimensional constellations in a manner similar to the case where N is a power of 2. $N_1$ and $N_2$ are chosen such that their sum is equal to N. Preferably the difference between $N_1$ and $N_2$ is 1. Assume that there are $M_1$ $2N_1$-dimensional subsets in each of the $2N_1$-dimensional families (or subfamilies), and $M_2$ $2N_2$-dimensional subsets in each of the $2N_2$-dimensional families. When $M_1$ is equal to $M_2$, the partition of the 2N-dimensional constellation is the same as in the case where N is a power of 2. Otherwise, assume that $M_1$ is smaller than $M_2$. Then each 2N-dimensional subset consists of $M_1$ 2N-dimensional types, each 2N-dimensional type being a pair of a $2N_1$-dimensional subset and a $2N_2$-dimensional subset. The $M_1$ $2N_1$-dimensional subsets associated with each 2N-dimensional subset span a same $2N_1$-dimensional family. And the $M_1$ $2N_2$-dimensional subsets associated with each 2N-dimensional subset are different from each other and belong to a same $2N_2$-dimensional family. Further grouping of 2N-dimensional subsets into families is done in a similar manner.

The design of a rotationally-invariant convolutional code, the differential encoder and decoder, and the bit converter and deconverter for the constellation mapping are done in the same manner as in the case where N is a power of 2. The search for the closest point in each of the 2N-dimensional subsets is again done in an iterative manner similar to that used in the partition of the 2N-dimensional constellation discussed above.

A combination of J $2N_j$-dimensional block encoders, for j equal to 1,2, . . . ,J, (of the kind previously described) operated in parallel can then be used to generate S additional bits, when needed, in a manner similar to that described above, however, without requiring that the resultant $NQ+S+1$ bits to be mapped into the 2N-dimensional constellation be evenly divisible by N.

The N constituent 2D constellations and the 2N-dimensional constellation are then formed accordingly in a manner similar to that described above. And the 2N-dimensional signal constellation mapping and demapping are performed accordingly by N uses of a table for the largest constituent 2D constellation involved.

In other embodiments, the convolutional coder may add more than one redundancy bit, the signaling slot can be other than a signaling interval in a QAM system, and the constituent 2D constellation can be from other than a rectangular lattice, for example hexagonal or circular.

I claim:

1. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding and said means for selecting define a partitioning of said multi-dimensional constellation into a plurality of multi-dimensional subsets and determine the subset from which said multi-dimensional signal point is selected based upon at least one of said signal point selection bits, said multi-dimensional constellation being a concatenation of constituent constellations each of which has fewer dimensions than said multi-dimensional constellation and is partitioned into constituent subsets, each said multi-dimensional subset being based upon said constituent subsets but being other than a concatenation of constituent subsets of said constituent constellations, and means for modulating at least one carrier for transmission over said channel in accordance with each selected said multi-dimensional signal point, said means for modulating being connected to be responsive to said means for selecting, and wherein said constituent subsets in each said constituent constellation are grouped to form constituent families such that the minimum distance between constituent points within each said constituent subset is greater than the minimum distance between constituent points within each said constituent family, which is in turn greater than the minimum distance between constituent points within said constituent constellation, said multi-dimensional constellation is partitioned into said multi-dimensional subsets based on said distances of said constituent families and subsets, said multi-dimensional subsets are grouped to form multi-dimensional families also based on said distances, and said constituent family comprises constituent subfamilies each of which comprises a plurality of said constituent subsets chosen such that the minimum distance between constituent points within each said constituent subfamily is greater than the minimum distance between constituent points within each said constituent family and is less than the minimum distance between constituent points within each said constituent subset, and said multi-dimensional constellation is partitioned into said multi-dimensional subsets also based on said distances of said constituent subfamilies.

2. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding said means for selecting define a partitioning of said multi-dimensional constellation into a plurality of multi-dimensional subsets and determine the subset from which said multi-dimensional signal point is selected based upon at least one of said signal point selection bits, said multi-dimensional constellation being a concatenation of constituent constellations each of which has fewer dimensions than said multi-dimensional constellation and is partitioned into constituent subsets, each said multi-dimensional subset being based upon said constituent subsets but being other than a concatenation of constituent subsets of said constituent constellations, and means for modulating at least one carrier for transmission over said channel in accordance with each selected said multi-dimensional signal point, said means for modulating being connected to be responsive to said means for selecting, and wherein said constituent subsets in each said constituent constellation are grouped to form constituent families such that the minimum distance between constituent points within each said constituent subset is greater than the minimum distance between constituent points within each said constituent family, which is in turn greater than the minimum distance between constituent points within said constituent constellation, said multi-dimensional constellation is partitioned into said multi-dimensional subsets based on said distances of said constituent families and subsets, said multi-dimensional subsets are grouped to form multi-dimensional families also based on said distances, and wherein each said multi-dimensional subset comprises multi-dimensional types each of which is a concatenation of said constituent subsets, and said constituent subsets that belong to a given said constituent constellation and that are associated with multi-dimensional types of a given said multi-dimensional subset, are different and belong to one said constituent family of said given constituent constellation.

3. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding and said means for selecting define a partitioning of said multi-dimensional constellation into a plurality of multi-dimensional subsets and determine the subset from which said multi-dimensional signal point is selected based upon at least one of said signal point selection bits, said multi-dimensional constellation being a concatenation of constituent constellations each of which has fewer dimensions than said multi-dimensional constellation and is partitioned into constituent subsets, each said multi-dimensional subset being based upon said constituent subsets but being other than a concatenation of constituent subsets of said constituent constellations, and means for modulating at least one carrier for transmission over said channel in accordance with each selected said multi-dimensional signal point, said means for modulating being connected to be responsive to said means fior selecting, and wherein each said multi-dimensional subset comprises multi-dimensional types each of which is a concatenation of said constituent subsets, and said constituent subsets that belong to a given said constituent constellation and that are associated with multi-dimensional types of a given said multi-dimensional subset, are different and belong to one said constituent subfamily of said given constituent constellation.

4. Apparatus for transmitting a stream of information bits by sending corresponding signals over a channel in a plurality of signaling slots, comprising means for encoding the information bits that appear during a block of at least two said slots by adding at least one redundant bit, to form a set of signal point selection bits for said block, means for selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding wherein said means for selecting establishes a correspondence between each possible combination of said signal point selection bits and the coordinates of a multi-dimensional signal point in said multi-dimensional constellation, wherein said means for encoding and said means for selecting define a partitioning of said multi-dimensional constellation into a plurality of multi-dimensional subsets, said multi-dimensional constellation being a concatenation of a plurality of constituent constellations each of which has fewer dimensions than said multi-dimensional constellation, said constituent constellations comprising arrangements of signal points which are ambiguous under phase rotations of particular amounts, wherein said means for encoding and said means for selecting cause said selected multi-dimensional signal points to be susceptible to being decoded in a manner that avoids the effect of channel-induced phase rotations of any of said amounts, and means for modulating at least one carrier for transmission over said channel in accordance with the coordinates represented by each selected said multi-dimensional signal point, said means for modulating being connected to be responsive to said means for selecting.

5. The apparatus of claim 4 wherein said means for encoding and said means for selecting are further arranged to define said partitioning into said multi-dimensional subsets so that the coordinates of each said multi-dimensional signal point in a given said multi-dimensional subset will be translated, under a phase rotation of any of said amounts, into the coordinates of another said multi-dimensional signal point in said given multi-dimensional subset.

6. The apparatus of claim 3 wherein said means for encoding comprises a convolutional coder which generates from at least one said information bit a plurality of convolutionally-encoded bits that include said redundant bit, said means for selecting selects the multi-dimensional subset from which said multi-dimensional point is drawn based on said convolutionally-encoded bits, and said means for encoding further comprises a differential encoder for differentially encoding at least one non-convolutionally-encoded said information bit to remove the ambiguity resulting from a rotation of any of said amounts.

7. The apparatus of claim 6, wherein said multi-dimensional constellation has 8 dimensions and said convolutional coder has 64 states.

8. The apparatus of claim 6 wherein said differential encoder differentially encodes only non-convolutionally-encoded said information bits.

9. The apparatus of claim 4 wherein each said constituent constellation is partitioned into constituent subsets such that a said constituent subset is translated into another said constituent subset under a phase rotation corresponding to one said particular amount, and said means for encoding and said means for selecting are arranged to define said partitioning of said multi-dimensional constellation such that each said multi-dimensional subset comprises multi-dimensional types each of which is a concatenation of said constituent subsets and said multi-dimensional subset is invariant under a rotation of said particular amount.

10. The apparatus of claim 9 wherein said types comprise all possible concatenations of said constituent subsets and each said type belongs to at least one said multi-dimensional subset.

11. The apparatus of claim 4 wherein said means for encoding and said means for selecting one further arranged to define said partitioning into said multi-dimensional subsets so that the coordinates of each said multi-dimensional signal point in a given said multi-dimensional subset will be translated, under phase rotations of at least one but not all of said amounts, into the coordinates of another said multi-dimensional signal point in said given multi-dimensional subset, and will be translated by another one of said amounts into the coordinates of another said multi-dimensional signal point in another said multi-dimensional subset, and said means for encoding and said means for selecting comprise a convolutional coder whose state transitions are associated with said multi-dimensional subsets so that the ambiguity resulting from said translation by said other amount is removed.

12. The apparatus of claim 11 wherein the multi-dimensional subset which results from rotating a first multi-dimensional subset by said other amount is assigned to a state transition which has a predetermined relationship to the state transition to which the first multi-dimensional subset is assigned.

13. The apparatus of claim 12 wherein if said first multi-dimensional subset is assigned to a transition from a first state to a second state of said convolutional coder, then said resulting multi-dimensional subset is assigned to a transition between two states determined by a predetermined one-to-one function of said first and second states.

14. The apparatus of claim 11 wherein said convolutional coder generates from at least one said information bit a plurality of convolutionally-encoded bits that include said redundant bit, said means for selecting selects the multi-dimensional subset from which said multi-dimensional point is drawn based on said convolutionally-encoded bits, and said means for encoding further comprises a differential encoder for differentially encoding at least one non-convolutionally-encoded said information bit to remove the ambiguity resulting from rotation by any of said amounts.

15. The apparatus of claim 14 wherein said convolutional coder is arranged to generate said convolutionally-encoded bits from bits which include at least one differentially coded said information bit.

16. The apparatus of claim 14 wherein said multi-dimensional constellation has 4 dimensions and said convolutional coder has 16 states.

17. The apparatus of claim 14 wherein said phase ambiguity amounts include 90°, 180°, 270°, and said convolutional coder is a linear convolutional coder.

18. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding and said means for selecting being arranged to define a partitioning of said multi-dimensional constellation into a plurality of multi-dimensional subsets, said multi-dimensional constellation being a concatenation of constituent constellations each of which has two dimensions and is partitioned into constituent subsets, each said multi-dimensional subset comprising at least two multi-dimensional subtypes each formed by a concatenation of said constituent subsets, said means for encoding comprising a convolutional encoder that generates from at least one said information bit a plurality of convolutionally-encoded bits that include said redundant bit, wherein said means for selecting selects the subtype from which said multi-dimensional signal point is drawn based on said convolutionally-encoded bits and at least one subtype selection bit from among non-convolutionally encoded said information bits, and means for modulating at least one carrier for transmission over said channel in accordance with the coordinates represented by each selected said multi-dimensional signal point, said means for modulating being connected to be responsive to said means for selecting.

19. The apparatus of claim 18 wherein
said means for encoding comprises a bit converter for translating each bit value combination of said subtype selection bits and said convolutionally-encoded bits into a plurality of groups of constituent subset selection bits, and said means for selecting is further arranged to use said groups respectively to specify the constituent subsets corresponding to the multi-dimensional subtype from which said multi-dimensional signal point is drawn.

20. The apparatus of claim 19 wherein the number of said subtype selection bits plus the number of said convolutionally-encoded bits is the same as the aggregate number of said constituent subset selection bits in said groups.

21. The apparatus of claim 18 wherein said multi-dimensional signal point belonging to said subtype is selected based on the remaining said information bits.

22. The apparatus of claim 18 wherein said constituent constellations comprise arrangements of signal points that are ambiguous under channel-induced phase rotations of at least one particular amount, and said means for encoding further comprises a differential encoder for differentially encoding at least one said subtype selection bit to cause said selected multidimensional signal points to be susceptible to being decoded in a manner which avoids the effect of channel-induced phase rotations of any of said amounts.

23. The apparatus of claim 18 wherein each said constituent subset is divided into first and second groups, and the groups from which the constituent signal points of each selected multi-dimensional signal point are drawn are based upon combination selection bits from among said remaining information bits such that the group from which one said constituent signal point is drawn depends on the group from which another said constituent signal point is drawn.

24. The apparatus of claim 23 wherein said two groups comprise inner and outer groups requiring respectively different average powers.

25. The apparatus of claim 23 wherein said means for encoding further comprises a block encoder for converting said combination selection bits into a plurality of sets of group selection bits used respectively to specify said constituent groups.

26. The apparatus of claim 25 wherein the same bit pattern of each said set of group selection bits is associated with constituent groups that are obtained from each other under a phase rotation corresponding to a phase ambiguity of said constituent constellation.

27. The apparatus of claim 23 wherein said remaining information bits, other than said combination selection bits, are organized in a plurality of sets each used to select a constituent signal point from one of said selected constituent groups.

28. The apparatus of claim 23 wherein said first and second groups of a said constituent subset can be obtained, respectively, from said first and second groups of another said constituent subset through a phase rotation corresponding to a phase ambiguity of said constituent constellation.

29. The apparatus of claim 28 wherein the same pattern of said combination selection bits is assigned to combinations of groups that are obtained from each other under a phase rotation corresponding to a phase ambiguity of said multi-dimensional constellation.

30. The apparatus of claim 27 or 29 wherein the same pattern of each said set of constituent signal point selection bits is associated with constituent signal points that are obtained from each other under a phase rotation corresponding to a phase ambiguity of said constituent constellation.

31. A technique for estimating the most likely sequence of multi-dimensional signal points to have been sent via a channel from a transmitter of the kind that causes said multi-dimensional signal points to carry information about said sequence based on state transitions of a finite state device, said multi-dimensional signal points being drawn from a multi-dimensional constellation partitioned into multi-dimensional subsets corresponding to said state transitions, said multi-dimensional constellation being a concatenation of constituent constellations having fewer dimensions, each said constituent constellation being partitioned into constituent subsets, each said multi-dimensional subset consisting of multi-dimensional types, each said type being a concatenation of said constituent subsets, each said multi-dimensional signal point being a concatenation of a plurality of constituent signal points of fewer dimensions, said technique comprising determining the distances between each received constituent signal and the nearest constituent signal points in the corresponding said constituent subsets, determining the distance between each said received multi-dimensional signal and the nearest multi-dimensional signal point in each said multi-dimensional subset based on a combination of said distances with respect to constituent subsets corresponding to said multi-dimensional subset, and determining said most likely sequence based on the distances between each said received multi-dimensional signal and the nearest multi-dimensional signal point in each said multi-dimensional subset.

32. The technique of claim 31 further comprising determining the distance between said received multi-dimensional signal and the nearest multi-dimensional signal point in each said multi-dimensional subset based on a combination of distances with respect to constituent subsets of each said multi-dimensional type within said multi-dimensional subset.

33. The technique of claim 31 wherein each said constituent constellation has more than 2 dimensions and is a concatenation of two-dimensional constellations, each said two-dimensional constellation being partitioned into two-dimensional subsets, said technique further comprising determining the distances between each received two-dimensional signal and the nearest two-dimensional signal points in the corresponding said two-dimensional subsets, and wherein said step of determining the distances between each received constituent signal and the nearest constituent signal points in said constituent subsets is based on combinations of said distances with respect to said two-dimensional subsets corresponding to said constituent subset.

34. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding and said means for selecting define a partitioning of said multi-dimensional constellation into a plurality of multi-dimensional subsets comprising respectively a multi-dimensional lattice and portions of translations of said lattice, said portions being of different types that said lattice, and means for modulating at least one carrier for transmission over said channel in accordance with the coordinates represented by each selected said multi-dimensional signal point, said means for modulating being connected to be responsive to said means for selecting.

35. The apparatus of claim 34 wherein said lattice comprises a multi-dimensional constellation of the type used in a block-coded modulation system.

36. Apparatus for transmitting a stream of information bits by sending corresponding signals over a channel in a plurality of signaling slots, comprising means for encoding the information bits that appear during a block of at least two said signaling slots by adding at least one redundant bit, to form a set of signal point selection bits for said block, means for selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, said means for selecting being connected to be responsive to said means for encoding, wherein said means for selecting establishes a correspondence between each possible combination of said signal point selection bits and the coordinates of a multi-dimensional signal point in said multi-dimensional constellation, wherein said means for encoding and said means for selecting define a partitioning of said multi-dimensional constellation into a plurality of multi-dimensional subsets, said multi-dimensional constellation being a concatenation of constituent constellations each of which has two dimensions, wherein said means for encoding and said means for selecting define a partitioning of said constitutent constellations into more than four constituent subsets, and means for modulating at least one carrier for transmission over said channel in accordance with the coordinates represented by each selected said multi-dimensional signal point said means for modulating being connected to be responsive to said means for encoding.

37. The apparatus of claim 1, 4, 18, or 36 wherein each said constituent constellation is divided into two groups and wherein all of said constituent subsets for each said constituent constellation have the same numbers of constituent signal points in each said group.

38. The apparatus of claim 1, 4, 18, or 36 wherein each said constituent constellation is divided into two groups.

39. The apparatus of claim 38 wherein said means for encoding and said means for selecting are arranged to exclude from said multi-dimensional constellation some multi-dimensional signal points which are concatenations of signal points belonging to constituent constellations, said multi-dimensional signal points which are excluded being based on the groups to which said constituent signal points belong.

40. The apparatus of claim 39 wherein there are N said constituent constellations and the groups in each constituent constellation include a first group that has N times as many signal points as the second group.

41. The apparatus of claim 40 wherein said excluded multi-dimensional signal points comprise multi-dimensional signal points which correspond to more than one constituent signal point in said second groups.

42. The apparatus of claim 38 wherein said constituent constellations include arrangements of signal points that are ambiguous under a channel-induced phase rotation of a particular amount, and each said group is invariant under a phase rotation of said particular amount.

43. The apparatus of claim 1, 4, 18, 34, or 36 wherein each said block spans N said signaling slots, N being a power of two.

44. The apparatus of claim 43 wherein N is 2.

45. The apparatus of claim 43 wherein N is 4.

46. The apparatus of claim 43 wherein N is 8.

47. The apparatus of claim 1, 4, 18, or 36 wherein said multi-dimensional constellation is a concatenation of constituent constellations including a 2N-dimensional constellation, N being a power of two.

48. The apparatus of claim 1, 8, 18, or 34 wherein the number of said multi-dimensional subsets is fewer than $4^N$ where 2N is the number of dimensions of said multi-dimensional constellation.

49. The apparatus of claim 48 wherein N is 2 and there are 8 said multi-dimensional subsets.

50. The apparatus of claim 48 wherein N is 4 and there are 16 said multi-dimensional subsets.

51. The apparatus of claim 46 wherein N is 8 and there are 32 said multi-dimensional subsets.

52. The apparatus of claim 1, 4, 18, 34, or 36 wherein the number of said multi-dimensional subsets is fewer than $8^N$ where 2N is the number of dimensions of said multi-dimensional constellation.

53. The apparatus of claim 52 wherein N is 2 and there are 32 said multi-dimensional subsets.

54. The apparatus of claim 1, 4, 18, 34, or 36 wherein the minimum distance within said multi-dimensional constellation is smaller than the minimum distance within each said multi-dimensional subset.

55. The apparatus of claim 1 or 4 wherein said constituent constellations are all two-dimensional constellations.

56. The apparatus of claim 1 or 4 wherein said constituent constellations are all four-dimensional constellations.

57. The apparatus of claim 1, 4, 18, or 36 wherein the minimum distance within each said constituent constellation is smaller than the minimum distance with each said constituent subset.

58. The apparatus of claim 4, wherein said phase ambiguity amounts include 90°, 180°, and 270°.

59. The apparatus of claim 36 wherein there are 8 said constituent subsets.

60. The apparatus of claim 38 wherein one said group is divided into subgroups that are rotationally invariant under phase rotations for which said constituent constellation is invariant.

61. The apparatus of claim 60 wherein all of said constituent subsets for each said constituent constellation have the same number of constituent signal points in each said subgroup.

62. The apparatus of claim 1, 4, 18, 34, or 36 wherein said multi-dimensional subsets comprise multi-dimensional families such that the minimum distance within each said family is greater than the minimum distance within said multi-dimensional constellation, and said encoding means is arranged to encode said information bits on the basis of said families.

63. The apparatus of claim 62 wherein said multi-dimensional families comprise multi-dimensional sub-families such that the minimum distance within each said subfamily is greater than the minimum distance within each said family.

64. The apparatus of claim 1, 4, 18, 34, or 36 wherein Q said information bits appear in each said signaling slot, Q being an integer.

65. The apparatus of claim 1, 4, 18, 34, or 36 wherein Q said information bits appear in each said signaling slot, Q being non-integral.

66. The apparatus of claim 64 wherein Q is 7.

67. The apparatus of claim 65 wherein Q is $6\frac{1}{8}$.

68. The apparatus of claim 65 wherein Q is $5\frac{1}{4}$.

69. The apparatus of claim 65 wherein Q is $4\frac{3}{8}$.

70. The apparatus of claim 1, 4, 18, 34, or 36 wherein said signaling slots correspond to successive signaling intervals.

71. The apparatus of claim 1, 4, 18, or 34 wherein
said information bits appear at the rate of seven per slot,
each said block spans two said signaling slots,
said multi-dimensional constellation has four dimensions,
said multi-dimensional constellation is partitioned into eight multi-dimensional subsets,
said means for encoding comprises a finite-state device having 16 states, and
said constituent constellations are two identical two-dimensional constellation each having 192 two-dimensional signal points.

72. The apparatus of claim 1, 4, 18, or 34 wherein
said information bits appear at the rate of seven per slot,
each said block spans four said signaling slots,
said multi-dimensional constellation has eight dimensions,
said multi-dimensional constellation is partitioned into sixteen multi-dimensional subsets,
said means for encoding comprises a finite-state device having 64 states, and
said constituent two-dimensional constellations are four identical two-dimensional constellations each having 160 two-dimensional signal points.

73. The apparatus of claim 1, 4, 18, 34, or 36 wherein
said information bits appear at the rate of seven per slot,
each said block spans two said signaling slots,
said multi-dimensional constellation has four dimensions,
said multi-dimensional constellation is partitioned into 32 multi-dimensional subsets,
said means for encoding comprises a finite-state device having 64 states, and
said constituent constellations are two identical two-dimensional constellations each having 192 two-dimensional signal points partitioned into eight subsets.

74. The apparatus of claim 6, wherein said phase ambiguity amounts include 90°, 180°, 270°, and said convolutional coder is a linear convolutional coder.

75. The apparatus of claim 1, 4, 18, 34, or 36 wherein said constituent constellations are portions of rectangular lattices.

76. The apparatus of claim 1, 4, 18, 34, or 36 wherein there is one said redundant bit.

77. The apparatus of claim 5 wherein said types comprise all possible concatenations of said constituent subsets and each said type belongs to at least one said multi-dimensional subset.

78. A method for transmitting a stream of information bits by sending corresponding signals over a channel in a plurality of signaling slots, comprising
encoding the information bits that appear during a block of at least two said signaling slots by adding at least one redundant bit, to form a set of signal point selection bits for said block,
selecting, for each said set of signal point selection bits a multi-dimensional signal point drawn from a multi-dimensional constellation for said block, said multi-dimensional signal point selected for a particular said block being dependent on the multi-dimensional signal point selected for at least one other said block,
establishing a correspondence between each possible combination of said signal point selection bits and the coordinates of a multi-dimensional signal point in said multi-dimensional constellation,
defining a partitioning of said multi-dimensional constellation into a plurality of multi-dimensional subsets and determining the subset from which said multi-dimensional signal point is selected based upon at least one of said signal point selection bits, said multi-dimensional constellation being a concatenation of constituent constellations each of which has fewer dimensions than said multi-dimensional constellation and is partitioned into constituent subsets, each said multi-dimensional subset being based upon said constituent subsets but being other than a concatenation of constituent subsets of said constituent constellations, and
modulating at least one carrier for transmission over said channel in accordance with each selected said multi-dimensional signal point.

79. A method for transmitting a stream of information bits by sending corresponding signals over a channel in a plurality of signaling slots, comprising
encoding the information bits that appear during a block of at least two said slots by adding at least one redundant bit, to form a set of signal point selection bits for said block,
selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, establishing a correspondence between each possible combination of said signal point selection bits and the coordinates of a multi-dimensional signal point in said multi-dimensional constellation, defining a partitioning of said multi-dimensional constellation into a plurality of multi-dimensional subsets, said multi-dimensional constellation being a concatenation of a plurality of constituent constellations each of which has fewer dimensions than said multi-dimensional constellation, said constituent constellations comprising arrangements of signal points which are ambiguous under phase rotations of particular amounts, causing said selected multi-dimensional signal points to be susceptible to being decoded in a manner that avoids the effect of channel-induced phase rotations of any of said amounts, and modulating at least one carrier for transmission over said channel in accordance with the coordinates represented by each selected said multi-dimensional signal point.

80. A method for transmitting a stream of information bits by sending corresponding signals over a channel in a plurality of signaling slots, comprising encoding the information bits that appear during a block of at least two said signaling slots by adding at least one redundant bit, to form a set of signal point selection bits for said block, selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, establishing a correspondence between each possible combination of said signal point selection bits and the coordinates of a multi-dimensional signal point in said multi-dimensional constellation, defining a partitioning of said multi-dimensional constellation into a plurality of multi-dimensional subsets, said multi-dimensional constellation being a concatenation of constituent constellations each of which has two dimensions and is partitioned into constituent subsets, each said multi-dimensional subset comprising at least two multi-dimensional subtypes each formed by a concatenation of said constituent subsets, generating from at least one said information bit a plurality of convolutionally-encoded bits that include said redundant bit, selecting the subtype from which said multi-dimensional signal point is drawn based on said convolutionally-encoded bits and at least one subtype selection bit from among non-convolutionally encoded said information bits, and modulating at least one carrier for transmission over said channel in accordance with the coordinates represented by each selected said multi-dimensional signal point.

81. A method for transmitting a stream of information bits by sending corresponding signals over a channel in a plurality of signaling slots, comprising encoding the information bits that appear during a block of at least two said signaling slots by adding at least one redundant bit, to form a set of signal point selection bits for said block, selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, establishing a correspondence between each possible combination of said signal point selection bits and the coordinates of a multi-dimensional signal point in said multi-dimensional constellation, defining a partitioning of said multi-dimensional constellation into a plurality of multi-dimensional subsets comprising respectively a multi-dimensional lattice and translations of said lattice, and modulating at least one carrier for transmission over said channel in accordance with the coordinates represented by each selected said multi-dimensional signal point.

82. A method for transmitting a stream of information bits by sending corresponding signals over a channel in a plurality of signaling slots, comprising encoding the information bits that appear during a block of at least two said signaling slots by adding at least one redundant bit, to form a set of signal point selection bits for said block, selecting, for each said set of signal point selection bits, a multi-dimensional signal point drawn from a multi-dimensional constellation for said block, said multi-dimensional signal point selected for a particular said block being dependent on the multi-dimensional signal point selected for at least one other said block, establishing a correspondence between each possible combination of said signal point selection bits and the coordinates of a multi-dimensional signal point in said multi-dimensional constellation, defining a partitioning of said multi-dimensional constellation into a plurality of multi-dimensional subsets, said multi-dimensional constellation being a concatenation of constituent constellations each of which has two dimensions, defining a partitioning of said constituent constellations into more than four constituent subsets, and modulating at least one carrier for transmission over said channel in accordance with the coordinates represented by each selected said multi-dimensional signal point.

* * * * *